(12) United States Patent
Jorgenson

(10) Patent No.: US 9,608,145 B2
(45) Date of Patent: Mar. 28, 2017

(54) MATERIALS, STRUCTURES, AND METHODS FOR OPTICAL AND ELECTRICAL III-NITRIDE SEMICONDUCTOR DEVICES

(71) Applicant: Robbie J. Jorgenson, Minneapolis, MN (US)

(72) Inventor: Robbie J. Jorgenson, Minneapolis, MN (US)

( * ) Notice: Subject to any disclaimer, the term of this patent is extended or adjusted under 35 U.S.C. 154(b) by 0 days.

(21) Appl. No.: 14/385,474

(22) PCT Filed: Mar. 14, 2013

(86) PCT No.: PCT/US2013/031800
§ 371 (c)(1),
(2) Date: Sep. 15, 2014

(87) PCT Pub. No.: WO2013/138676
PCT Pub. Date: Sep. 19, 2013

(65) Prior Publication Data
US 2015/0034902 A1 Feb. 5, 2015

Related U.S. Application Data

(60) Provisional application No. 61/610,943, filed on Mar. 14, 2012, provisional application No. 61/623,885, (Continued)

(51) Int. Cl.
*H01L 31/0304* (2006.01)
*H01L 33/00* (2010.01)
(Continued)

(52) U.S. Cl.
CPC ........ *H01L 31/03044* (2013.01); *B82Y 20/00* (2013.01); *G02B 6/1225* (2013.01);
(Continued)

(58) Field of Classification Search
CPC ......... H01L 31/03044; H01L 31/02327; H01L 33/0075
See application file for complete search history.

(56) References Cited

U.S. PATENT DOCUMENTS 4,780,749 A 10/1988 Schulman
5,362,977 A 11/1994 Hunt et al.
(Continued)

FOREIGN PATENT DOCUMENTS

JP 09-232631 9/1997
JP 1998321954 12/1998
(Continued)

OTHER PUBLICATIONS

Chen, N.C., et al., "Nitride light-emitting diodes grown on Si (111) using a TiN template", "Applied Physics Letters", May 10, 2006, pp. 191110-1-191110-3, vol. 88, No. 191110.
(Continued)

*Primary Examiner* — Mark Prenty
(74) *Attorney, Agent, or Firm* — Charles A. Lemaire; Jonathan M. Rixen; Lemaire Patent Law Firm, P.L.L.C.

(57) ABSTRACT

The present invention provides materials, structures, and methods for III-nitride-based devices, including epitaxial and non-epitaxial structures useful for III-nitride devices including light emitting devices, laser diodes, transistors, detectors, sensors, and the like. In some embodiments, the present invention provides metallo-semiconductor and/or metallo-dielectric devices, structures, materials and methods of forming metallo-semiconductor and/or metallo-dielectric material structures for use in semiconductor devices, and more particularly for use in III-nitride based semiconductor devices. In some embodiments, the present invention includes materials, structures, and methods for improving the crystal quality of epitaxial materials grown on non-native substrates. In some embodiments, the present inven-
(Continued)

tion provides materials, structures, devices, and methods for acoustic wave devices and technology, including epitaxial and non-epitaxial piezoelectric materials and structures useful for acoustic wave devices. In some embodiments, the present invention provides metal-base transistor devices, structures, materials and methods of forming metal-base transistor material structures for use in semiconductor devices.

20 Claims, 20 Drawing Sheets

Related U.S. Application Data filed on Apr. 13, 2012, provisional application No. 61/655,477, filed on Jun. 4, 2012.

(51) Int. Cl.

| | |
|---|---|
| *H01L 33/32* | (2010.01) |
| *H01L 21/02* | (2006.01) |
| *H01L 41/187* | (2006.01) |
| *H01L 29/20* | (2006.01) |
| *G02B 6/122* | (2006.01) |
| *B82Y 20/00* | (2011.01) |
| *H01L 31/0232* | (2014.01) |
| *H01L 31/0352* | (2006.01) |
| *H01L 31/18* | (2006.01) |
| *H01L 33/06* | (2010.01) |
| *H01L 33/10* | (2010.01) |
| *H03H 9/02* | (2006.01) |

(52) U.S. Cl.
CPC ...... *H01L 21/0237* (2013.01); *H01L 21/0254* (2013.01); *H01L 21/02458* (2013.01); *H01L 21/02491* (2013.01); *H01L 21/02507* (2013.01); *H01L 29/2003* (2013.01); *H01L 31/02327* (2013.01); *H01L 31/035209* (2013.01); *H01L 31/1856* (2013.01); *H01L 33/007* (2013.01); *H01L 33/0075* (2013.01); *H01L 33/06* (2013.01); *H01L 33/10* (2013.01); *H01L 33/32* (2013.01); *H01L 41/187* (2013.01); *H01L 2933/0058* (2013.01); *H03H 9/02015* (2013.01); *H03H 9/02543* (2013.01)

(56) References Cited

U.S. PATENT DOCUMENTS

| | | | |
|---|---|---|---|
| 5,557,627 A | 9/1996 | Schneider et al. |
| 5,619,059 A | 4/1997 | Li et al. |
| 5,882,948 A | 3/1999 | Jewell |
| 5,966,393 A | 10/1999 | Hide et al. |
| 6,045,626 A | 4/2000 | Yano et al. |
| 6,100,545 A | 8/2000 | Chiyo et al. |
| 6,239,005 B1 | 5/2001 | Sumiya et al. |
| 6,420,199 B1 | 7/2002 | Coman et al. |
| 6,426,512 B1 | 7/2002 | Ito et al. |
| 6,531,719 B2 | 3/2003 | Shibata et al. |
| 6,549,556 B1 | 4/2003 | Hwang |
| 6,563,141 B1 | 5/2003 | Dawson et al. |
| 6,573,537 B1 | 6/2003 | Steigerwald |
| 6,589,808 B2 | 7/2003 | Chiyo et al. |
| 6,614,060 B1 | 9/2003 | Wang et al. |
| 6,784,085 B2 | 8/2004 | Cuomo et al. |
| 6,800,500 B2 | 10/2004 | Coman et al. |
| 6,831,302 B2 | 12/2004 | Erchak et al. |
| 6,872,965 B2 | 3/2005 | Ito et al. |
| 6,929,867 B2 | 8/2005 | Armitage et al. |
| 6,943,377 B2 | 9/2005 | Gaska et al. |
| 6,969,874 B1 | 11/2005 | Gee et al. |
| 6,998,281 B2 | 2/2006 | Taskar et al. |
| 7,030,417 B2 | 4/2006 | Ishibashi et al. |
| 7,148,520 B2 | 12/2006 | Yoo |
| 7,176,483 B2 | 2/2007 | Grupp et al. |
| 7,215,692 B2 | 5/2007 | Jewell |
| 7,223,998 B2 | 5/2007 | Schwach et al. |
| 7,279,347 B2 | 10/2007 | Hon et al. |
| 7,332,365 B2 | 2/2008 | Nakamura et al. |
| 7,335,924 B2 | 2/2008 | Liu et al. |
| 7,339,728 B2 * | 3/2008 | Hartig ..................... C03C 17/36 |
| | | | 359/359 |
| 7,345,315 B2 | 3/2008 | Hon et al. |
| 7,368,316 B2 | 5/2008 | Yokouchi et al. |
| 7,465,592 B2 | 12/2008 | Yoo |
| 7,582,910 B2 | 9/2009 | David et al. |
| 7,825,006 B2 | 11/2010 | Nakamura et al. |
| 7,842,939 B2 | 11/2010 | Jorgenson et al. |
| 7,915,624 B2 | 3/2011 | Jorgenson |
| 8,373,363 B2 | 2/2013 | Grajcar |
| 2001/0043629 A1 | 11/2001 | Sun et al. |
| 2006/0202211 A1 | 9/2006 | Ueda et al. |
| 2006/0273324 A1 | 12/2006 | Asai et al. |
| 2007/0045607 A1 | 3/2007 | Chen et al. |
| 2007/0096127 A1 | 5/2007 | Pattison et al. |
| 2010/0176369 A2 | 11/2009 | Oliver et al. |
| 2013/0048939 A1 | 2/2013 | Zhang et al. |
| 2015/0034902 A1 * | 2/2015 | Jorgenson ........... H01L 21/0237 |
| | | | 257/13 |

FOREIGN PATENT DOCUMENTS

| | | |
|---|---|---|
| JP | 2000261033 | 9/2000 |
| JP | 2000323753 | 11/2000 |
| JP | 2003163373 | 6/2003 |

OTHER PUBLICATIONS

Oliver, Mark H., et al., "Organometallic vapor phase epitaxial growth of GaN on ZrN/AlN/Si substrates", "Applied Physics Letters", Jul. 16, 2008, pp. 023109-1-023109-3, vol. 93, No. 023109.

Pattison, Paul Morgan, "Fabrication and characterization of Gallium Nitride based Macro-Cavity Light Emitting Diodes", "ProQuest Information and Learing Company", Sep. 2006, p. 1-128, vol. 3238796.

Shen, Y.C., et al., "Optical cavity effects in InGaN—GaN quantum-well-heterostructure flip-chip light-emitting diodes", "Applied Physics Letters", Apr. 7, 2003, pp. 2221-2223, vol. 82, No. 14.

* cited by examiner

EXAMPLES OF METALLO-SEMICONDUCTOR STRUCTURES ACCORDING TO SOME EMBODIMENTS OF THE PRESENT INVENTION:

REFLECTIVITY OF HFN AND 530NM TUNED FOUR PERIOD HFN/ALN METALLOSEMICONDUCTOR

Simulated 530nm Tuned HfN/AlN MetalloSemiconductor Reflector

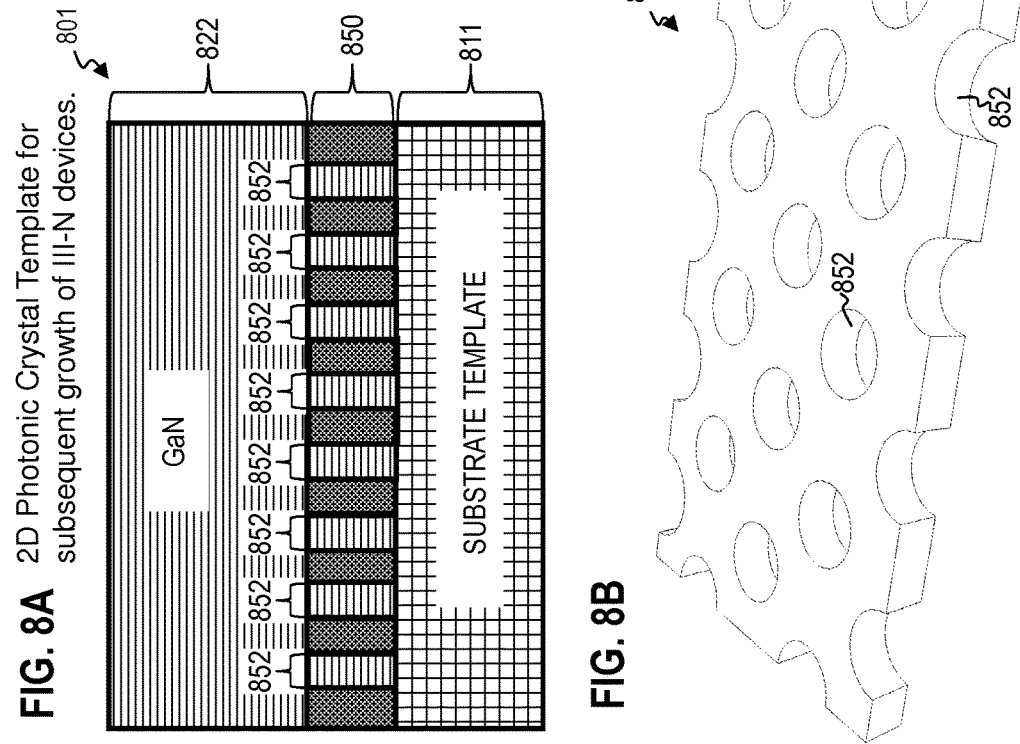
FIG. 8A 2D Photonic Crystal Template for subsequent growth of III-N devices.
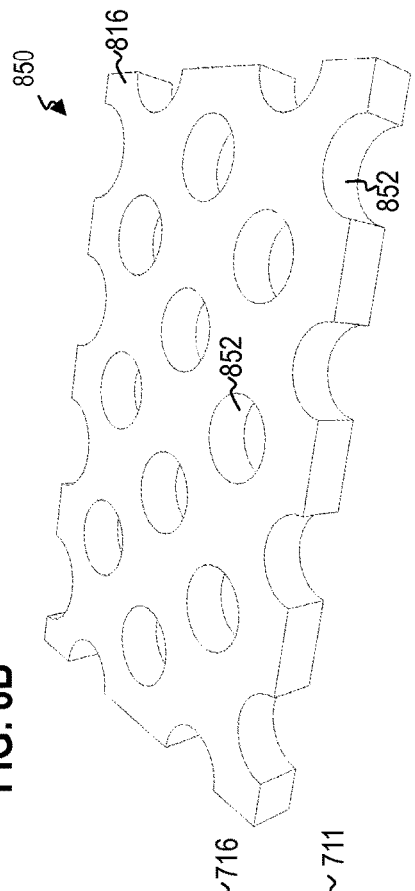
FIG. 8B
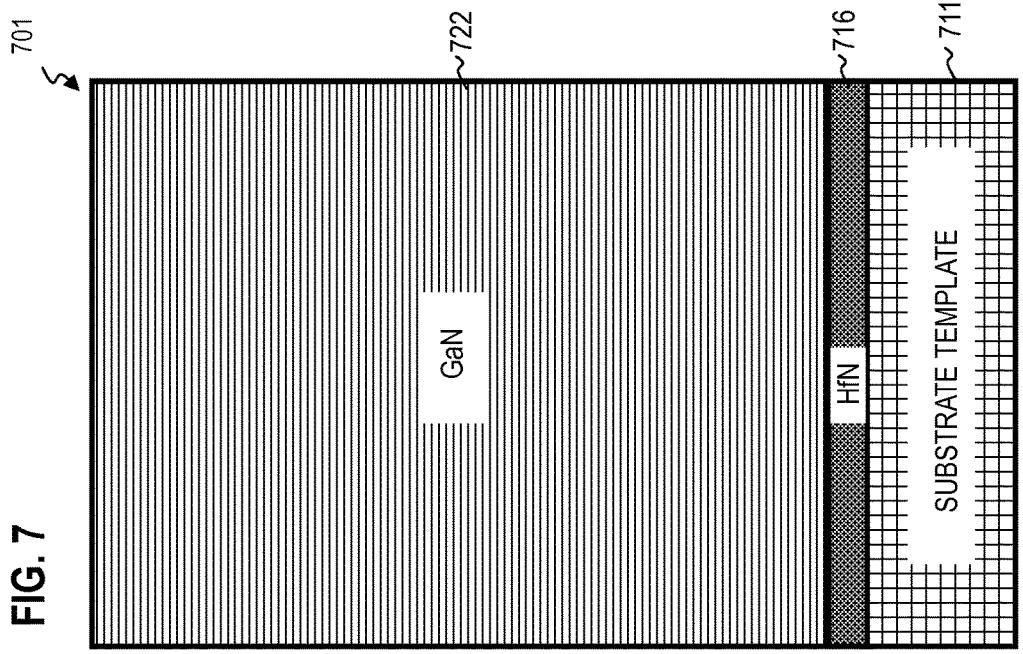
FIG. 7

3D Photonic Crystal Template for subsequent growth of III-N devices.

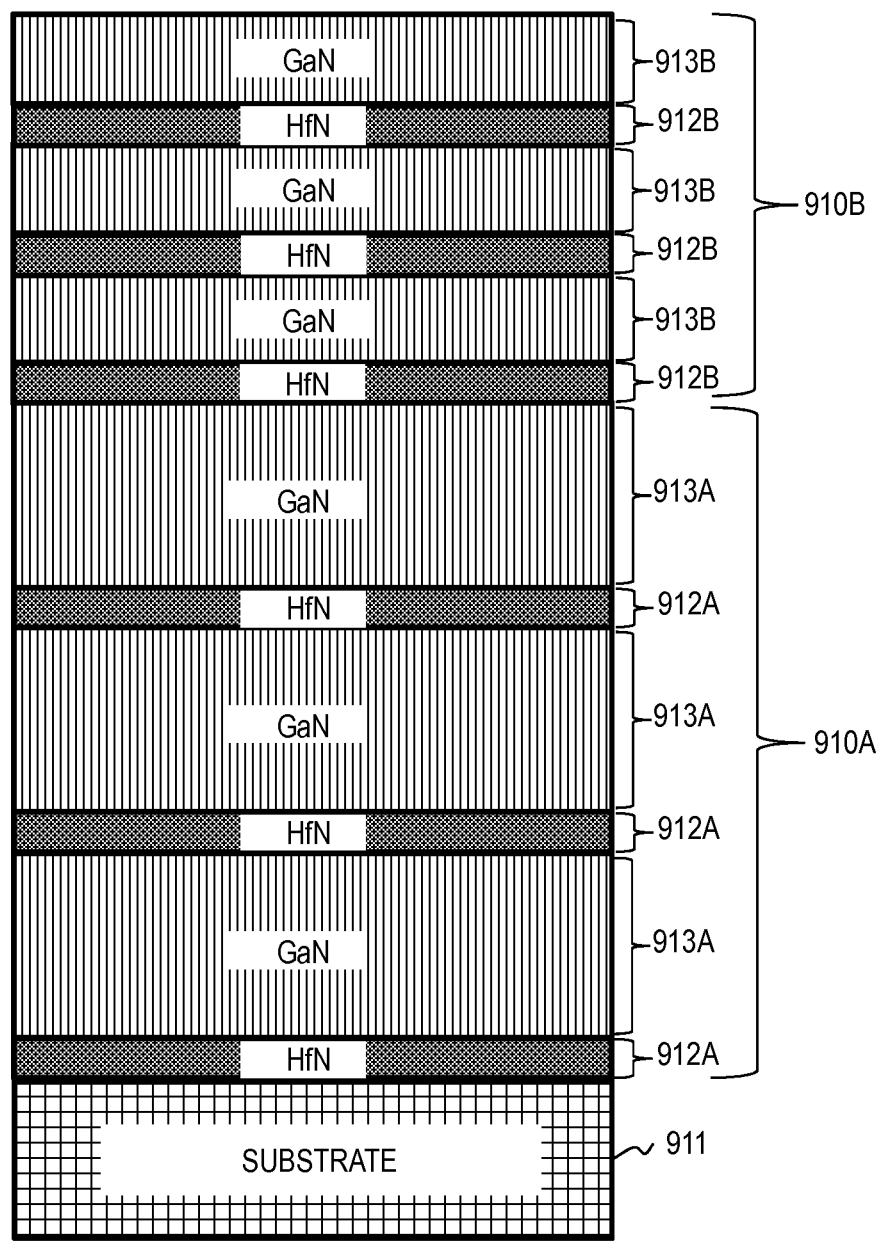
FIG. 9 Tandem Reflector

FIG. 14A
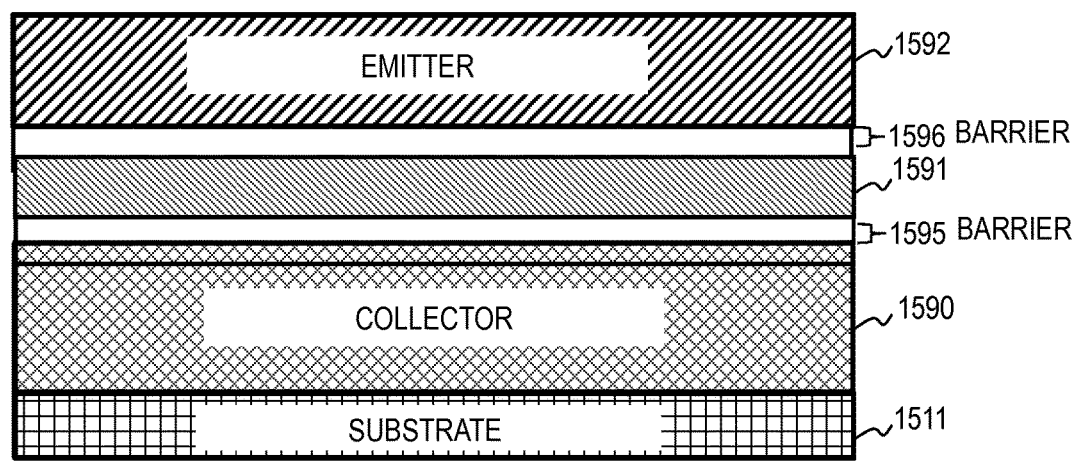
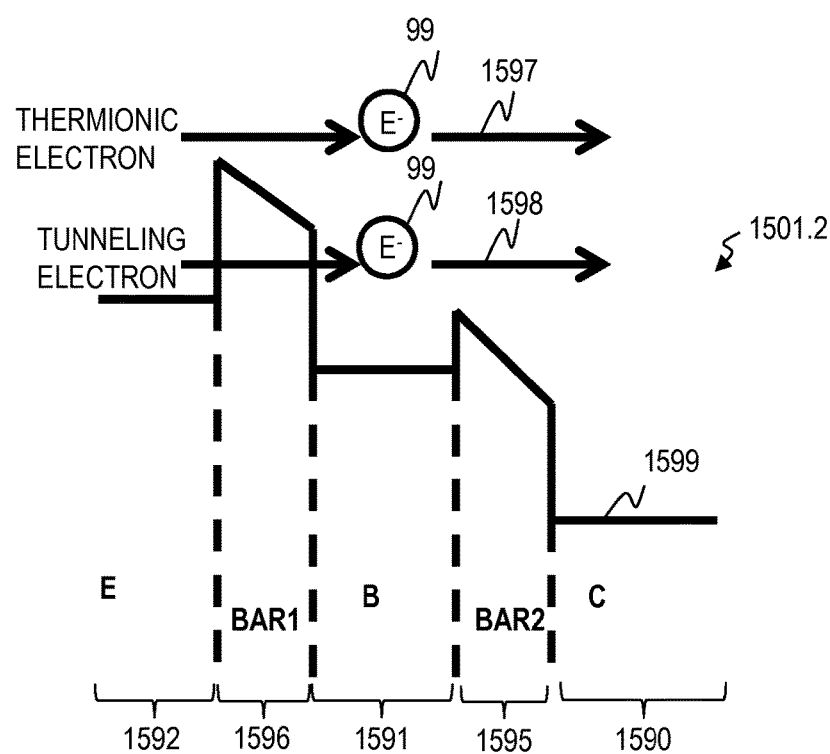

FIG. 14B
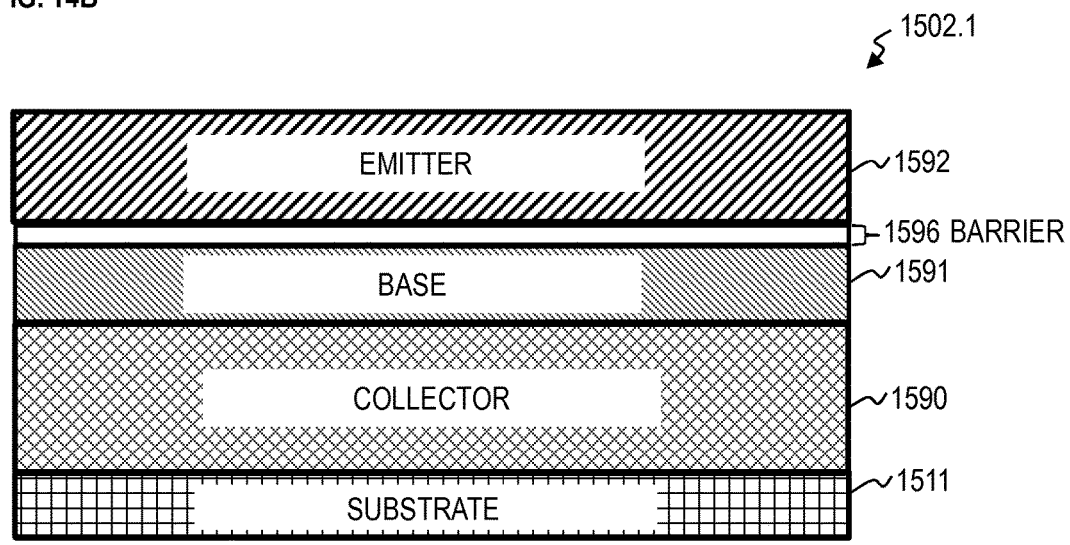
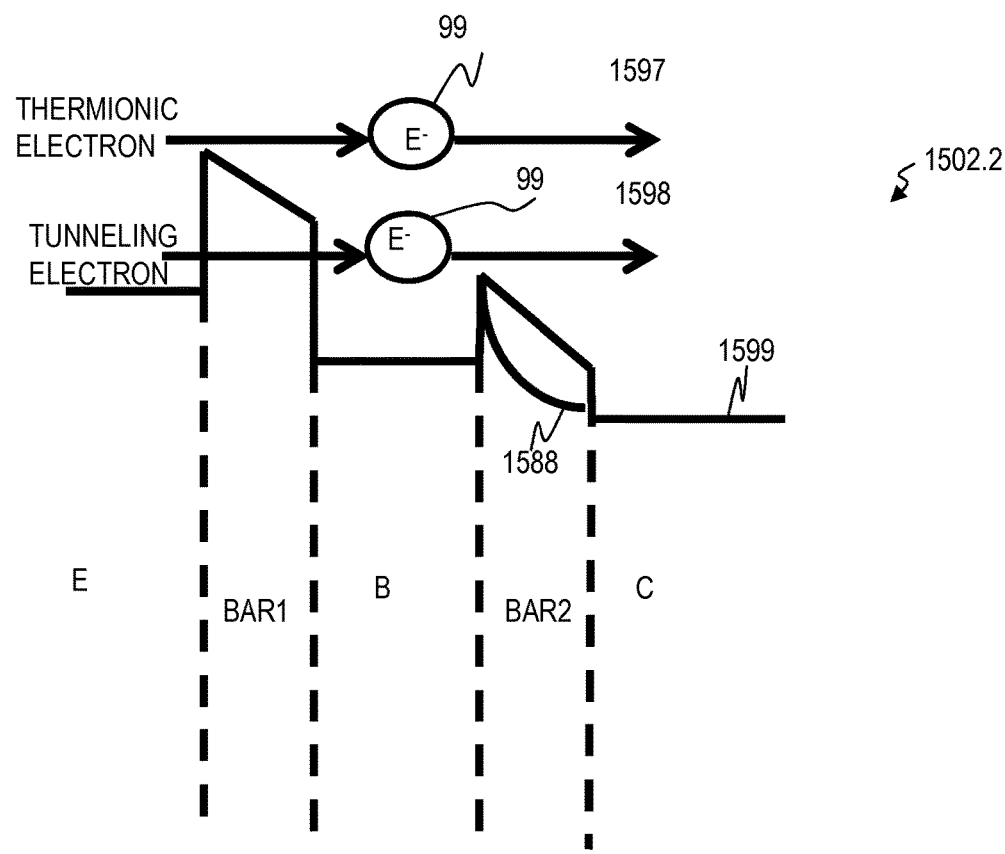

FIG. 14C
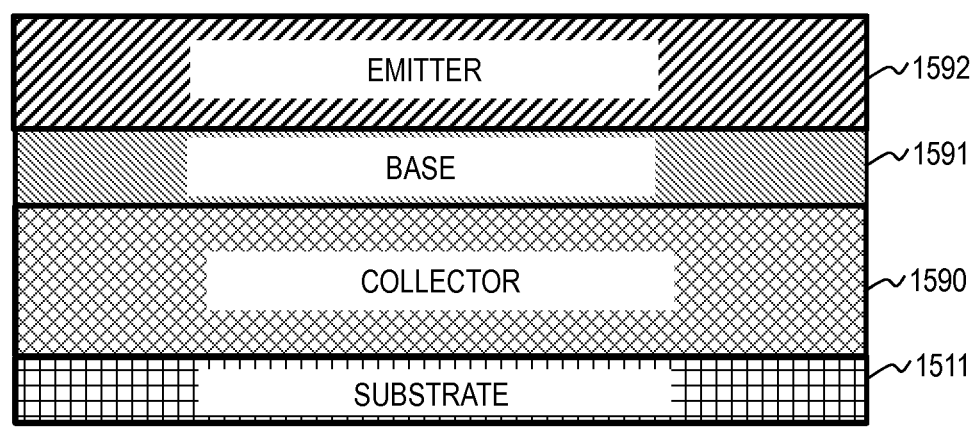
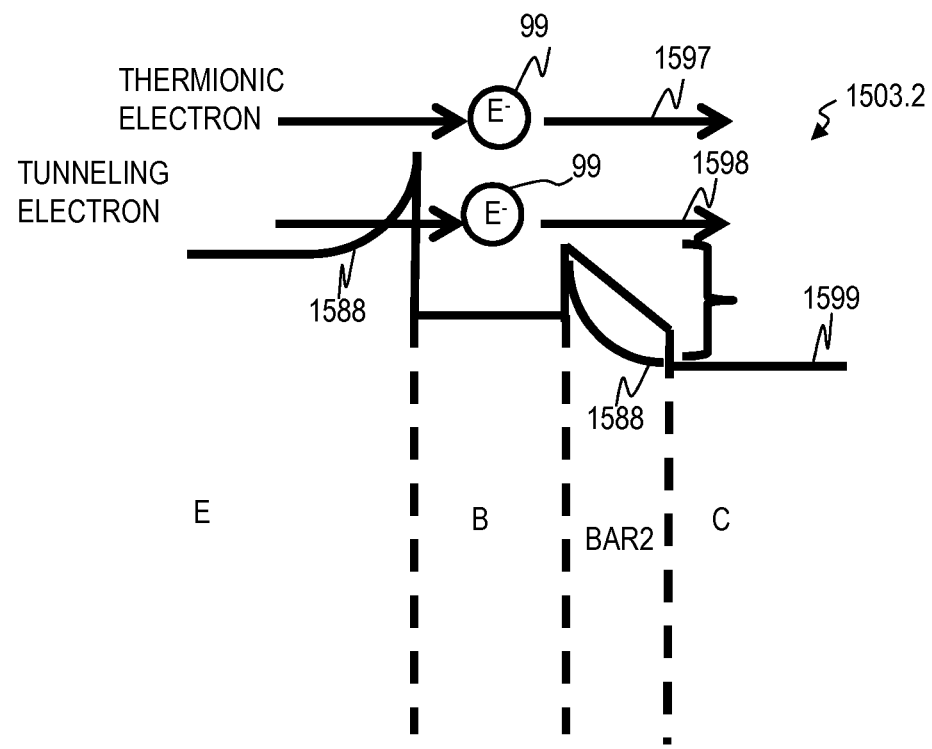

FIG. 14D
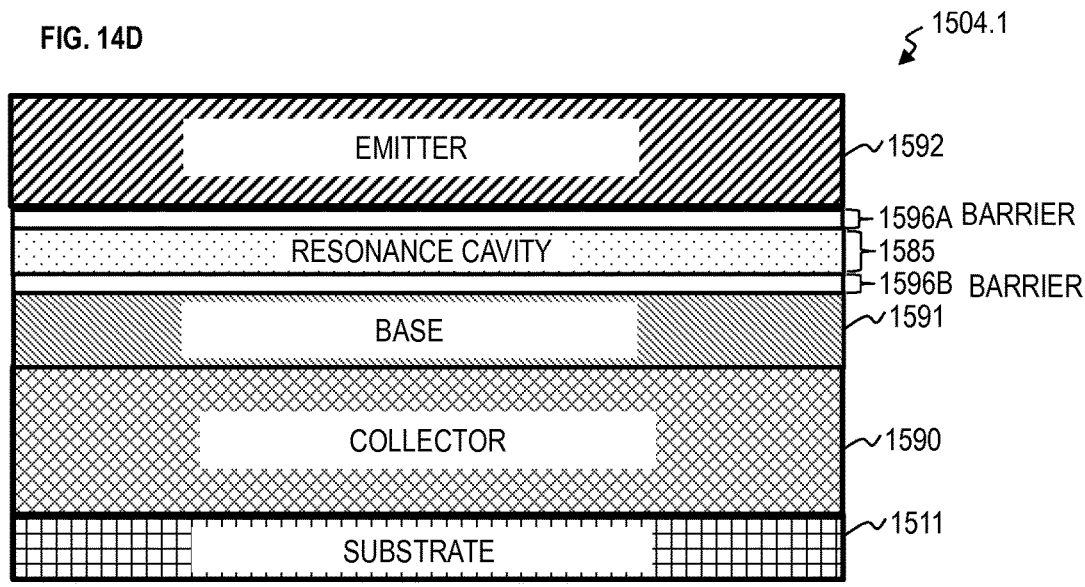
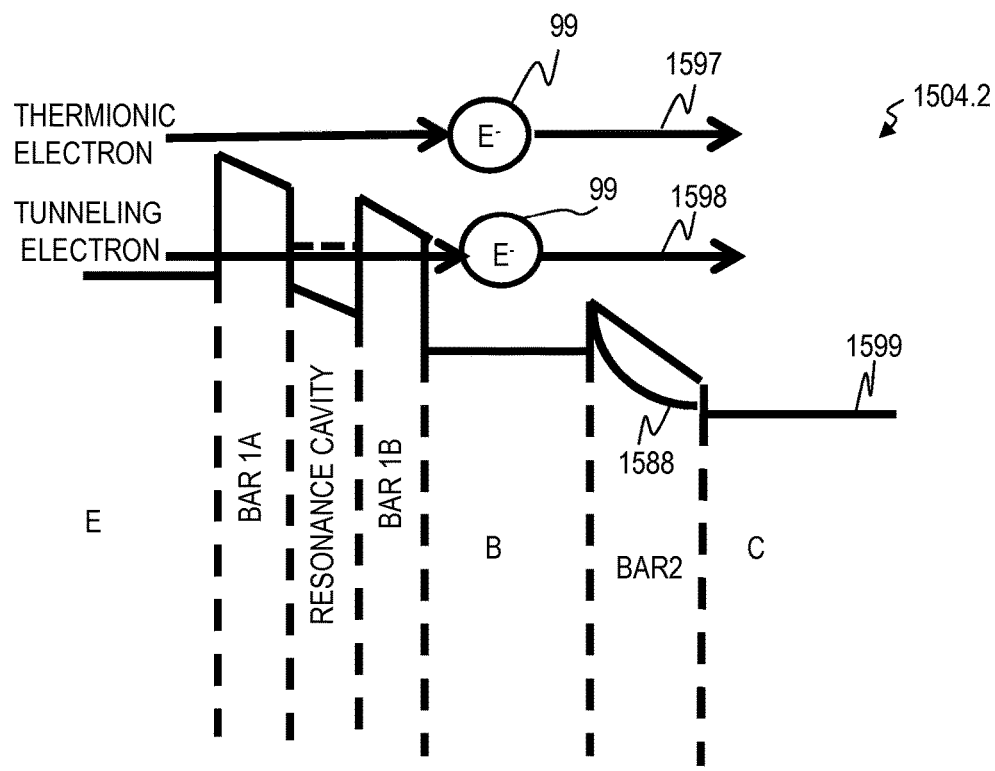

MATERIALS, STRUCTURES, AND METHODS FOR OPTICAL AND ELECTRICAL III-NITRIDE SEMICONDUCTOR DEVICES

CROSS-REFERENCE TO RELATED APPLICATIONS

This application is a national-phase filing of, and claims priority benefit of, PCT Patent Application No. PCT/US2013/031800, filed Mar. 14, 2013 and titled "MATERIALS, STRUCTURES, AND METHODS FOR OPTICAL AND ELECTRICAL III-NITRIDE SEMICONDUCTOR DEVICES," which claims priority benefit of:

U.S. Provisional Patent Application No. 61/610,943, titled "METALLO-SEMICONDUCTOR STRUCTURES FOR III-NITRIDE DEVICES" filed Mar. 14, 2012;

U.S. Provisional Patent Application No. 61/623,885, titled "STRUCTURES FOR III-NITRIDE DEVICES" filed Apr. 13, 2012; and U.S. Provisional Patent Application No. 61/655,477, titled "METAL-BASE TRANSISTORS FOR III-NITRIDE DEVICES" filed Jun. 4, 2012; each of which is incorporated herein by reference in its entirety.

This is related to prior:

U.S. Provisional Patent Application No. 60/835,934, titled "III-NITRIDE LIGHT-EMITTING DEVICES WITH ONE OR MORE RESONANCE REFLECTORS AND REFLECTIVE ENGINEERED GROWTH TEMPLATES FOR SUCH DEVICES, AND METHODS" filed Aug. 6, 2006;

U.S. Provisional Patent Application No. 60/821,588, titled "III-NITRIDE LIGHT-EMITTING DEVICES WITH ONE OR MORE RESONANCE REFLECTORS AND REFLECTIVE ENGINEERED GROWTH TEMPLATES FOR SUCH DEVICES, AND METHODS" filed Aug. 7, 2006;

U.S. Provisional Patent Application No. 61/066,960, titled "CURRENT-INJECTING/TUNNELING LIGHT EMITTING DEVICE AND METHOD" filed Feb. 25, 2008;

U.S. Provisional Patent Application No. 61/068,299, titled "LIFTOFF METHOD, RESULTING MATERIALS AND DEVICES" filed Mar. 5, 2008;

U.S. Provisional Patent Application No. 61/125,367, titled "Engineered Substrates" filed Apr. 24, 2008;

U.S. Provisional Patent Application No. 61/384,401, titled "III-NITRIDE ALTERNATING-CURRENT LIGHT-EMITTING DEVICE AND METHOD" filed Sep. 20, 2010;

U.S. Provisional Patent Application No. 61/394,725, titled "III-NITRIDE DEVICE AND METHOD" filed Oct. 19, 2010;

U.S. Provisional Patent Application No. 61/445,595, titled "III-NITRIDE DEVICE, MATERIALS AND METHOD" filed Feb. 23, 2011;

U.S. patent application Ser. No. 11/882,730, now U.S. Pat. No. 7,915,624 filed Sep. 3, 2007, titled "III-NITRIDE LIGHT-EMITTING DEVICES WITH ONE OR MORE RESONANCE REFLECTORS AND REFLECTIVE ENGINEERED GROWTH TEMPLATES FOR SUCH DEVICES, AND METHODS";

U.S. patent application Ser. No. 13/075,104, now U.S. Pat. No. 8,253,157 (a divisional of U.S. Pat. No. 7,915,624) filed Mar. 29, 2011, titled "III-NITRIDE LIGHT-EMITTING DEVICES WITH REFLECTIVE ENGINEERED GROWTH TEMPLATES AND METHODS OF MANUFACTURE";

U.S. patent application Ser. No. 13/597,130 (a divisional of U.S. Pat. No. 8,253,157) filed Aug. 28, 2012, now U.S. Pat. No. 8,890,183, titled "III-NITRIDE LIGHT-EMITTING DEVICES WITH REFLECTIVE ENGINEERED GROWTH TEMPLATES AND MANUFACTURING METHOD";

U.S. patent application Ser. No. 12/393,029, now U.S. Pat. No. 7,842,939 filed Feb. 25, 2009, titled "CURRENT-INJECTING/TUNNELING LIGHT-EMITTING DEVICE AND METHOD";

U.S. patent application Ser. No. 12/956,640, (a divisional of U.S. Pat. No. 7,842,939) filed Nov. 30, 2010, now U.S. Pat. No. 8,865,492, titled "METHOD OF FORMING CURRENT-INJECTING/TUNNELING LIGHT-EMITTING DEVICE";

U.S. patent application Ser. No. 13/237,914, titled "III-NITRIDE ALTERNATING-CURRENT LIGHT-EMITTING DEVICE AND METHOD" filed Sep. 20, 2011 (now abandoned); and U.S. patent application Ser. No. 13/656,660, titled "III-NITRIDE INTEGRATED CIRCUITS, ELEMENTS, AND METHOD" filed Oct. 19, 2012 (now abandoned); each of which is incorporated herein by reference in its entirety.

There are multiple embodiments described herein, each of which can be combined with one or more other embodiments described herein and/or incorporated by reference.

FIELD OF THE INVENTION

The present invention relates to the field of semiconductor devices and methods of manufacturing semiconductor devices, and more specifically to materials, structures, and methods for optical and electrical III-nitride-based semiconductor devices, some embodiments of which provide epitaxially grown metal-containing layers, electrically insulating layers, highly electrically conductive layers, highly optically transmissive layers, highly optically reflective layers, n-type semiconductors, p-type semiconductors, i-type (intrinsic) semiconductors, metallo-semiconductor structures, metallo-dielectric structures, and combinations of one or more of the above layers.

BACKGROUND OF THE INVENTION

Gallium nitride (GaN), a wide bandgap semiconductor, has received significant interest and investment from educational, governmental, and industrial entities due to the potential for fabricating advanced optical and electrical GaN-based semiconductor devices. Beginning in the early 1990's, researchers have made continuous progress in researching developing, improving, and ultimately commercializing GaN-based semiconductor devices, including green and blue wavelength light emitting diodes (LEDs), blue wavelength laser diodes (LDs), and high-speed and high-power metal-semiconductor field effect transistors (MESFETs), high-electron mobility transistors (HEMTs), and power transistors.

While significant progress has been made in the development of Group-III nitride (hereafter, "III-nitride")-based semiconductor devices, further improvements in device materials, structures, and methods of fabrication are needed to realize the full potential, in terms of device performance, efficiency, and cost metrics, of III-nitride-based devices. Therefore, there is an unmet need in the industry for materials, structures, and methods for improving the performance, efficiency, and cost of III-nitride-based semiconductor devices. In addition, there is a further unmet need in the industry for a so-called metal-base transistor, which has been commercially unavailable do to the difficulty in forming high-quality semiconductor/metal/semiconductor epitaxial structures.

SUMMARY OF THE INVENTION

The present invention provides metallo-semiconductor structures comprising a substrate having a top surface and a bottom surface; and one or more periods of a metallo-semiconductor on the top surface of the substrate, wherein each of the one or more periods includes a first layer and a second layer, wherein the first layer is a metal and the second layer is a semiconductor, and wherein the first layer is substantially lattice matched to the second layer.

In some embodiments, the present invention provides metallo-semiconductor and/or metallo-dielectric devices, structures, materials and methods of forming metallo-semiconductor and/or metallo-dielectric material structures for use in semiconductor devices, and more particularly for use in III-nitride based semiconductor devices. In some embodiments, the present invention includes materials, structures, and methods for improving the crystal quality of epitaxial materials grown on non-native substrates. In some embodiments, the present invention provides materials, structures, devices, and methods for acoustic wave devices and technology, including epitaxial and non-epitaxial piezoelectric materials and structures useful for acoustic wave devices. In some embodiments, the present invention provides metal-base transistor devices, structures, materials and methods of forming metal-base transistor material structures for use in semiconductor devices.

BRIEF DESCRIPTION OF THE DRAWINGS

FIG. 7 is a block diagram of III-nitride substrate structure 701 that includes a sacrificial metallic layer, according to some embodiments of the present invention.

FIG. 8A is a block diagram of III-nitride growth template 801 that includes a 2-dimensional (2D) photonic-crystal (PhC) GEMM layer, according to some embodiments of the present invention.

FIG. 8B is a perspective drawing of 2D PhC-GEMM layer 802, according to some embodiments of the present invention.

FIG. 9 is a block diagram of III-nitride tandem reflector growth template 901 that includes a plurality of 1D PhC-GEMM structures, according to some embodiments of the present invention.

FIG. 14A is a block diagram of metal base transistor structure 1501.1 and corresponding energy diagram 1501.2, according to some embodiments of the present invention.

FIG. 14B is a block diagram of metal base transistor structure 1502.1 and corresponding energy diagram 1502.2, according to some embodiments of the present invention.

FIG. 14C is a block diagram of metal base transistor structure 1503.1 and corresponding energy diagram 1503.2, according to some embodiments of the present invention.

FIG. 14D is a block diagram of metal base transistor structure 1504.1 and corresponding energy diagram 1504.2, according to some embodiments of the present invention.

DESCRIPTION OF PREFERRED EMBODIMENTS

Figure 1A:
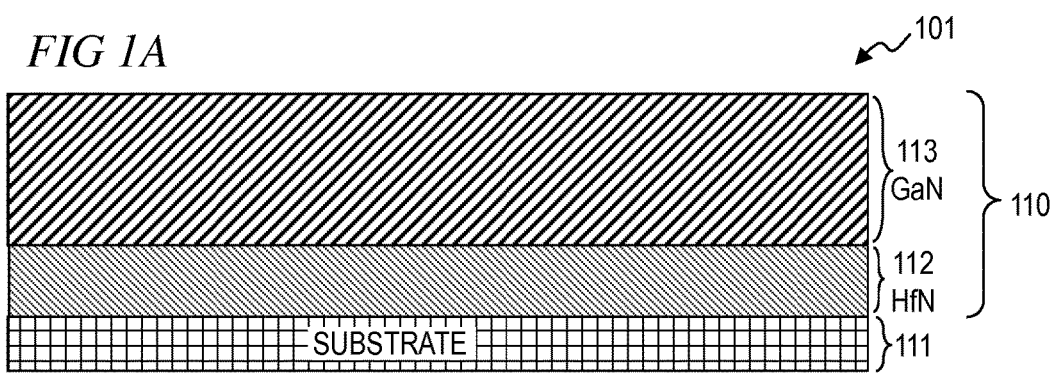
FIG. 1A is a block diagram of a two-layer metallo-semiconductor structure 101, according to some embodiments of the present invention.

Although the following detailed description contains many specifics for the purpose of illustration, a person of ordinary skill in the art will appreciate that many variations and alterations to the following details are within the scope of the invention. Very narrow and specific examples are used to illustrate particular embodiments; however, the invention described in the claims is not intended to be limited to only these examples, but rather includes the full scope of the attached claims. Accordingly, the following preferred embodiments of the invention are set forth without any loss of generality to, and without imposing limitations upon the claimed invention. Further, in the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention. The embodiments shown in the Figures and described here may include features that are not included in all specific embodiments. A particular embodiment may include only a subset of all of the features described, or a particular embodiment may include all of the features described.

The leading digit(s) of reference numbers appearing in the Figures generally corresponds to the Figure number in which that component is first introduced, such that the same reference number is used throughout to refer to an identical component which appears in multiple Figures. Signals and connections may be referred to by the same reference number or label, and the actual meaning will be clear from its use in the context of the description.

In some embodiments, the present invention provides materials, structures, and methods for III-nitride-based devices, including epitaxial and non-epitaxial structures useful for III-nitride devices including light emitting devices, laser diodes, transistors, detectors, sensors, and the like.

In some embodiments, the present invention provides metallo-semiconductor and/or metallo-dielectric devices, structures, materials and methods of forming metallo-semiconductor and/or metallo-dielectric material structures for use in semiconductor devices, and more particularly for use in III-nitride based semiconductor devices.

Specifically, in some embodiments, the present invention provides devices, structures, and materials that include combinations of one or more layers of metallic materials and one or more layers of semiconductor materials, dielectric materials, and/or combinations of semiconductor and dielectric materials, and methods of forming such devices, structures, and materials. In some embodiments, the one or more metallic layers and the one or more semiconductor and/or dielectric layers are epitaxial.

As used herein, the term "epitaxial" refers to a material state (i.e., not a process) of inorganic materials based on the materials' electrical or electrical and optical relationship with other inorganic materials that it is physically in contact with (typically layered), such that the materials are substantially lattice matched (i.e., the atomic lattices of the two or more materials line up in a predictable and organized repeating atomic lattice structure) and that the materials are substantially single crystal (i.e., the strain of the lattice mismatch and layer thickness, 1) does not generate undesired cracking within the device, 2) does not generate dislocations with densities large enough and/or of the type to result in undesired electrical shorting of the device such that the device can not be useful, and 3) does not generate a secondary material phase (e.g., inclusions, precipitates, poly-crystal grains, and/or multi crystal grains) such that the device is not useful).

In addition, as one of skill in the art would understand, carbon-containing compounds, such as carbides, carbonates, simple oxides of carbon (e.g., CO and $CO_2$), and cyanides, as well as the allotropes of carbon (e.g., diamond and graphite), are considered to be inorganic materials.

In some embodiments, the present invention provides a plurality of alternating layers of epitaxial metal and semiconductor materials to form epitaxial metallo-semiconductor devices, structures, and materials and methods of forming such epitaxial metallo-semiconductor devices, structures, materials, such that the metal layers and semiconductor layers are substantially lattice matched. In some embodiments, the present invention provides a plurality of alternating layers of epitaxial metal and dielectric materials to form epitaxial metallo-dielectric devices, structures, and materials and methods of forming such epitaxial metallo-dielectric devices, structures, materials, such that the metal layers and dielectric layers are substantially lattice matched. In some embodiments, the present invention provides a plurality of alternating layers of epitaxial metal, semiconductor, and dielectric materials to form epitaxial metallo-semiconductor-dielectric devices, structures, and materials and methods of forming such epitaxial metallo-semiconductor-dielectric devices, structures, materials, such that the metal layers and dielectric layers are substantially lattice matched.

As used herein, the term "period" refers to a set of alternating material layers, wherein each material layer is adjacent to the next material layer. For example, in some embodiments, for a metallo-semiconductor structure that includes two unique material layers (e.g., alternating layers of HfN and GaN), each set of HfN—GaN layers is referred to as a period. In such an example, if there were twenty (20) total layers alternating between HfN and GaN, the structure would include ten (10) periods of HfN—GaN. In another example, if there were twenty (20) total layers alternating between HfN and AlN, the structure would include ten (10) periods of HfN—AlN. In yet another example, if there were twenty (20) total layers alternating between HfN and compounds made of AlN, GaN and/or InN while being intentionally doped or not doped, the structure would include ten (10) periods of HfN-compounds made of AlN, GaN and/or InN while being intentionally doped or not doped. As another example, in some embodiments, for a metallo-semiconductor structure that includes three unique material layers (e.g., alternating layers of HfN, GaN, and AlN), each set of HfN—GaN—AlN layers is referred to as a period. In this additional example, if there were twenty-one (21) total layers alternating between HfN, GaN, and AlN, the structure would include seven (7) periods of HfN—GaN—AlN. As another example, in some embodiments, for a metallo-semiconductor structure that includes three unique material layers (e.g., alternating layers of HfN, AlN, and GaN), each set of HfN—AlN—GaN layers is referred to as a period. In this additional example, if there were twenty-one (21) total layers alternating between HfN, AlN, and GaN, the structure would include seven (7) periods of HfN—AlN—GaN.

In some embodiments, the present invention provides a PhC-GEMM structure with about one (1) period, or about two (2) periods, or about three (3) periods, or about (4) periods, or about five (5) periods, or about six (6) periods, or about seven (7) periods, or about eight (8) periods, or about nine (9) periods, or about ten (10) periods, or between about 10 periods and about 15 periods, or between about 15 periods and about 20 periods, or between about 20 periods and about 25 periods, or between about 25 periods and about 30 periods, or between about 30 periods and 40 periods, or between about 40 periods and 50 periods, or greater than about 50 periods.

In some embodiments, the present invention provides a PhC-GEMM structure having period thicknesses that are increasing in thickness with each period in the direction that is moving away from the active region, and wherein the thickness of the metal material layers are each substantially equal.

In some embodiments, the present invention provides a PhC-GEMM structure having a plurality of period thicknesses, wherein the thickness of the metal material layers and/or the thickness of the III-nitride layers each have various magnitudes.

In some embodiments, the present invention provides a PhC-GEMM structure with a maximum reflectivity of about 50% to about 70%, or 70% to about 80%, or 80% to about 85%, or about 85% to about 90%, or about 90% to about 91%, or about 91% to about 92%, or about 92% to about 93%, or about 93% to about 94%, or about 94% to about 95%, or about 95% to about 96%, or about 96% to about 97%, or about 97% to about 98%, or about 98% to about 99%, or greater than about 99%, for wavelengths in a range between 350 nm and 600 nm.

In some embodiments, the present invention provides a PhC-GEMM structure with a maximum reflectivity bandwidth, for reflectivity greater than about 80%, of about 5 nm to about 10 nm, or about 10 nm to about 15 nm, or about 15 nm to about 20 nm, or about 20 nm to about 25 nm, or about 25 nm to about 30 nm, or about 30 nm to about 35 nm, or about 35 nm to about 40 nm, or about 40 nm to about 45 nm, or about 45 nm to about 50 nm, or about 50 nm to about 60 nm, or about 60 nm to about 70 nm, or about 70 nm to about 80 nm, or about 80 nm to about 90 nm, or about 90 nm to about 100 nm, for wavelengths in a range between 350 nm and 600 nm.

In some embodiments, the present invention includes one or more unique PhC-GEMM structures integrated into a single growth template. For example, in some embodiments, a first PhC-GEMM structure includes a first number of periods of a first metal material having a first metal material thickness and a first semiconductor material having a first semiconductor material thickness, and wherein the first PhC-GEMM structure is integrated with a second PhC-GEMM structure that includes a second number of periods of a second metal material having a second metal material thickness and a second semiconductor material having a second semiconductor material thickness.

In some embodiments, the present invention includes metal materials, herein referred to as epitaxial metals, or metal-containing layers, or metallic layers, in the metallo-semiconductor and/or metallo-dielectric structure, device and method, wherein the metal materials include, but are not limited to, refractory metals and transition metals, including, but not limited to Hf, Zr, Ti, V, Nb, Ta, Cr, Mo, and/or W, including combinations of one or more or the refractory and transition metals. In other embodiments the metal materials include, but are not limited to, the refractory metal nitrides and transition metal nitrides, including, but not limited to HfN, ZrN, TiN, VN, NbN, TaN, CrN, MoN, and/or WN, including combinations of one or more refractory metal nitrides and transition metal nitrides. In other embodiments the metal materials include, but are not limited to, the refractory-metal borides, refractory-metal diborides and transition-metal borides and transitional-metal diborides. In some embodiments, the metal materials include, but are not limited to, refractory metals and/or metallic compounds, such as the Group IVB metals Zr, Hf, ($Hf_xZr_{1-x}$, where x is between 0 and 1, inclusive), and the transitional metal diborides ZrB2, HfB2, YB2 and ($Hf_xZr_yY_zB_2$ where x+y+z=1, and x and y and z are each between 0 and 1, inclusive) and the transitional metal nitrides ZrN, HfN, TiN, YZrN and ($Hf_x Zr_y Y_z$ N where x+y+z=1, and x and y and z are each between 0 and 1, inclusive). In some embodiments, the metal materials include one or more of the previously described materials.

In some embodiments, the semiconductor materials include group III-group V compound semiconductor materials including GaN, AlN, InN, $Al_xGa_{1-x}N$ (for x between 0 and 1, inclusive), $In_xGa_{1-x}N$ (for x between 0 and 1, inclusive), and/or quaternary $Al_xIn_yGa_zN$ (for x+y+z=1, and x and y and z are each between 0 and 1, inclusive) materials.

In some embodiments, dielectric materials in the metallo-dielectric structure, device and method, include, but are not limited to, metal oxides, (e.g., $HfO_2$, $ZrO_2$, ZnO, $TiO_2$, $Nb_2O_3$, $Y_2O_3$, $Yb_2O_3$, $Ta_2O_5$, $MoO_2$, and the like), conventional semiconductor dielectrics (e.g., "oxides" "nitrides", $SiO_2$, $GeO_2$, $Si_3N_4$, $Ga_2O_3$, $In_2O_3$, $Al_2O_3$, and the like), and silicates (e.g., $HfSiO_4$, $ZrSiO_4$, and the like).

In other embodiments, the semiconductor materials include elemental semiconductor materials, compound semiconductor materials, tertiary semiconductor materials, quaternary semiconductor materials, each of which are well known by those having skill in the art and include, but are not limited to Si, Ge, GaAs, InAs, AlAs, AlGaAs, InGaAs, AlInGaAs, GaP, InGaP, AlGaP, AlInGaP, GaSb, ZnS, and/or the like.

In some embodiments, the plurality of alternating layers are formed or provided on a substrate or template, wherein the substrate or template includes GaN-on-Si, GaN-on-Sapphire, GaN-on-SiC, SiC, GaN, ZnO, AlN, HfN, ZrN, $HfB_2$, $ZrB_2$.

In some embodiments, the above described metallo-semiconductor structures include metal materials and semiconductor materials as described previously.

In some embodiments, the plurality of alternating layers, or periods, are formed using traditional and standard epitaxial methods used in the semiconductor arts, including, but not limited to, molecular-beam epitaxy (MBE), metal-organic chemical-vapor deposition (MOCVD), metal-organic vapor-phase epitaxy (MOVPE), hydride vapor-phase epitaxy (HVPE), physical vapor deposition (PVD), including sputtering, atomic-layer deposition (ALD), combinations thereof, and/or the like.

In some embodiments, the plurality of alternating layers, or periods, or single periods or single layers are formed epitaxial using cathode arc deposition or cathode arc deposition where the beam is magnetically turned away from the perpendicular source direction such that the optical properties of the III-nitrides and of the refractory metal nitrides are improved. In some such embodiments, the light absorption of III-nitride materials is reduced and/or the reflectivity and/or transparency of the refractory metal nitrides may be increased.

In some embodiments, the plurality of alternating layers, or periods, or single periods or single layers are formed epitaxial using cathode arc deposition or cathode arc deposition where the beam is magnetically turned away from the perpendicular source direction such that the optical properties of the III-nitrides and of the refractory metal nitrides are improved. In some such embodiments, the light absorption of III-nitride materials may be reduced or the reflectivity and/or transparency of the refractory metal nitrides may be increased. Cathode arc deposition has a higher degree of ionization than other thin film deposition processes resulting in materials with higher degree of crystallinity leading to reduced light absorption of III-nitride materials or the higher reflectivities and/or transparency of the refractory metal nitrides.

In some embodiments, light emitting devices includes a PhC-GEMM structure with a reflectance spectra and transmission spectra that is matched in order that the population of emission wavelengths is divided in order that shorter emission wavelengths overlaps a high reflectivity region of the reflectance spectra and longer emission wavelengths overlap a high transmissivity region of the transmission spectra. In some such embodiments, such a PhC-GEMM structure could be provided on both sides of the active region or on one side of the active region where on the other side a mirror is placed or any other photonic structure is placed. As an example, in the case of a mirror on one side and an overlapping reflectance/transmission spectra in relation to the emission wavelength being on the other side, light could resonate at the shorter wavelengths and then could escape through some slight nonuniformity in the PhC-GEMM and/or could escape through being converted to a slightly longer wavelength through a reabsorption process. In some such embodiments, several optical processes are exploited to achieve increased efficiency devices for energy savings or increased performance devices having higher modulation rates for higher data rates of optical signal transfer.

In some embodiments, one or more dielectric material layers are included with and/or combined with the metallo-semiconductor structures described above to form a metallo-semiconductor-dielectric structure that is useful for electrical and optical semiconductor devices.

In some embodiments, the metallo-semiconductor structure includes a plurality of metal layers and semiconductor layers, wherein the thickness of all of the metal layers are substantially the same and the thickness of all the semiconductor layers are substantially the same. In other embodiments, the thicknesses of the metal layers vary according to the requirements of the device and the thickness of the semiconductor layers vary according to the requirements of the device.

In some embodiments, metallo-semiconductor materials, structures, and devices are substantially transparent to selected wavelengths of optical radiation depending on the thicknesses of the metal and semiconductor layers to be used for transparent structures for light exiting conduits for generated light within light emitting devices. In some other embodiments, metallo-semiconductor materials, structures, and devices are made to transmit some wavelengths of light and reflect other wavelengths of light. In some such embodiments, this is helpful for transmitting light emitted from a diode to a phosphor for photon down conversion such that the newly emitted light from the phosphor is reflected by the metallo-semiconductor layer structure.

In some embodiments, metallo-semiconductor materials, structures, and devices are beneficial for the subsequent epitaxial growth of a light-emitting device or electronic device, such as a transistor.

In some embodiments, the plurality of alternating layers of metal and semiconductor materials form metallo-semiconductor devices and structures and are used as mirrors (e.g., including highly reflective mirrors, and semi-transparent mirrors), optical filters (e.g., including band-pass filters, high-pass filters, and low-pass filters), sensors, photonic crystal structures, plasmonic devices, and/or the like.

In some embodiments, the material for the GEMM comprises various metals and metal compounds which may be epitaxially grown closely lattice matched to the substrate or growth template, or the buffer layer, or other layers located in the light-emitting device and having sufficient device quality, thereby avoiding the difficulties and reduced device performance caused by high dislocation densities. In some embodiments, the GEMM materials are thermal-expansion matched to the substrate or growth template, or the buffer layer, or other layers located in the light-emitting device and having sufficient device quality, thereby reducing the likelihood of cracking and dislocation densities.

In some embodiments, the epitaxial metal material layers are herein referred to as a grown-epitaxial metal mirror (GEMM). In some embodiments, the alternating metallo-semiconductor layers, and/or the alternating metallo-dielectric layers, and/or the alternating metallo-semiconductor-dielectric layers are referred to as a one-dimensional photonic-crystal GEMM (1D-PhC-GEMM) structure. In some embodiments, a single GEMM layer is patterned and etched through to form a plurality of etched-through regions and a new material having an index of refraction that is different from the index of refraction of the single GEMM layer is epitaxially grown in the etched-through regions to form a two-dimensional photonic-crystal GEMM (2D-PhC-GEMM) layer. In some embodiments, a plurality of 2D-PhC-GEMM layers is stacked on top of one another to form a three-dimensional photonic-crystal GEMM (3D-PhC-GEMM) structure. In some embodiments, the term "PhC-GEMM" is used to describe a 1D-PhC-GEMM structure, and/or a 2D-PhC-GEMM layer, and/or a 3D-PhC-GEMM structure, and/or a combination of a 1D-PhC-GEMM structure with a 2D-PhC-GEMM layer and/or a 3D-PhC-GEMM structure.

In some embodiments, the PhC-GEMM structure of the present invention is integrated with conventional photonic-crystal material structures, including one-dimensional (1D) photonic crystals, two-dimensional (2D) photonic crystals, or three-dimensional (3D) photonic crystals according to well-known photonic crystal principles (see, e.g., PHOTONIC CRYSTALS: MOLDING THE FLOW OF LIGHT (SECOND EDITION) by John D. Joannopoulos et al., Princeton University Press; 2nd edition (Feb. 11, 2008), ISBN number 13:978-0691124568), which is hereby incorporated by reference in its entirety.

In some embodiments, the metallo-semiconductor layers and/or the metallo-dielectric layers and/or the metallo-semiconductor-dielectric layers are used to form semiconductor devices, including light emitting devices (LEDs), resonant-cavity LEDs (RC-LEDs), micro-cavity LEDs (MC-LEDs), laser diodes (LDs), vertical-cavity surface emitting lasers (VCSELs), transistors, sensors, detectors, plasmonic devices, and/or the like.

In some embodiments, the materials, structures, and devices described herein are used for fabricating LED-based solid state lighting (SSL) luminaires, lamps, fixtures, and the like. In some embodiments, the PhC-GEMM LEDs described herein are designed to emit blue light and are integrated with a phosphor-doped material in order to produce white light. In some embodiments, a PhC-GEMM-based LED device is integrated with a selective transmission mirror (e.g., a blue-pass mirror that is transparent to blue light). In some embodiments, a Photonic Crystal GEMM LED is coupled to a blue-pass mirror located at or near the light-exiting face of the PhC-GEMM LED such that the blue-pass mirror allows the blue light generated by the PhC-GEMM LED to pass through the mirror to interact with and excite the phosphor-doped material to generate white light. In some embodiments, the generated white light is reflected by the blue-pass mirror, thereby blocking the white light and preventing its entry back into the PhC-GEMM LED. In some embodiments, the blue-pass mirror reduces heating of the die. Additional benefits of integrating the PhC-GEMM with the blue pass mirror are described in Parkyn et al., "Remote phosphor with recycling blue-pass mirror", Sep. 8, 2005, Proceedings of SPIE, vol. 5942, which is hereby incorporated by reference in its entirety.

In some embodiments, the present invention provides photonic structures that include one or more periods of alternating layers of metal materials (e.g., HfN) and III-nitride materials (e.g., AlN) to produce photonic structures for tuning the reflectivity spectrum of the photonic structure. In some embodiments, the peak of the reflectivity and reflectivity bandwidth spectrum is larger when HfN and GaN are used as the alternating materials due to the larger difference in the real index of refraction between GaN and HfN ($\Delta n \approx 2.0$) as compared to AlN and HfN ($\Delta n \approx 1.6$). In addition, HfN and GaN are substantially lattice matched and therefore the material quality (e.g., surface roughness, full-width at half-max (FWHM) of the x-ray diffraction (XRD) rocking-curve, and the like) of the HfN—GaN structure will be improved as compared to a HfN—AlN structure.

In some embodiments, the metallo-semiconductor structure is epitaxially grown on a GaN/sapphire to provide a highly reflective, highly electrically conductive PhC-GEMM structure. In some embodiments, this structure dramatically improves the reflectivity of the GEMM over a range of wavelengths, tunable from approximately 370 nm to approximately 700 nm due to the large and continuous difference in the real index of refraction. In some embodiments, with proper selection of the thicknesses of the metallic layer and semiconductor layers of the PhC-GEMM structure, the reflectivity spectrum of the PhC-GEMM is tunable to select specific peak wavelengths and bandwidths and therefore address specific and diverse application areas.

Over the past decade, researchers and companies in the III-nitride industry have spent significant resources in the development of distributed Bragg reflectors (DBRs) with only moderate success due to the limitations of the III-nitrides materials. For example, the most common materials used for forming III-nitride-based DBRs are GaN and $Al_xGa_{1-x}N$, and because there is a very low contrast in the refractive indexes between the GaN and AlGaN layers, a large number of periods and/or AlGaN layers with a high Al content is required in order to obtain a mirror with a reflectivity of only approximately 50%. However, both of these requirements increase the thermal expansion coefficient mismatch and lattice mismatch between the GaN and AlGaN layers resulting in the appearance of cracks on the DBR surface that degrades the growth and operation of the light-emitting device. Due to these limitations, achieving DBR's with reflectivities of greater than 80%, as desired by LED manufacturers, is simply not feasible using traditional III-nitride materials.

Whereas, in a conventional distributed Bragg reflector (DBR) is formed from alternating layers of semiconductor and/or dielectric materials, with each material layer having a thickness of a quarter-wavelength of the incident light within each material, in some embodiments, the PhC-GEMM structure includes alternating layers of metal and semiconductor and/or dielectric materials and the thickness of the metal layers is adjusted to allow partial reflection and partial transmission and the thickness of the semiconductor and/or dielectric layer is adjusted to be approximately a half-wavelength of the incident light. In some embodiments, the PhC-GEMM includes metal material layers having a thickness that reflects a portion of the incident light and transmits a portion of the incident light through each metal layer and semiconductor material layers (e.g., GaN, AlN and the like) having a thickness that is equal to approximately half of the wavelength of the incident light to produce constructive interference of the light in the semiconductor material layer that is located between two of the thin metal layers in a manner similar to a Fabry-Perot cavity.

In some embodiments, the thickness of the metal layer is between about 1 nm and about 5 nm, or between about 5 nm and about 10 nm, or between about 10 nm and about 15 nm, or between about 15 nm and about 20 nm, or between about 20 nm and about 30 nm, or between about 30 nm and about 40 nm, or between about 40 nm and about 50 nm, or between about 50 nm and about 75 nm, or between about 75 nm and about 100 nm, or between about 100 nm and about 150 nm, or between about 150 nm and about 200 nm. In some embodiments, the thickness of the metal layer is preferably between about 15 nm and about 45 nm.

In some embodiments, the thickness of the semiconductor layer and/or the dielectric layer is approximately half the wavelength of the incident light in the semiconductor layer and/or the dielectric layer when the metal layers are thin (e.g., 10 nm), as determined by $t_{layer} = \lambda_{layer}/2 = \lambda_o/2n_{layer}$, where $n_{layer}$ is the index of refraction of the layer, $\lambda_{layer}$ is the wavelength of the incident light in the layer, and $\lambda_o$ is the wavelength of the incident light in vacuum. For example, the required thickness for a GaN layer (i.e., $n_{GaN}=2.39$) and incident light of wavelength 450 nm (i.e., blue light) would be approximately 94 nm. In such a structure the reflectivity band can be quite narrow. In other embodiments, the thickness of the metal material layers is increased such that the reflectivity band is broadened and the peak wavelength is shifted. In some embodiments, to position the peak reflectance to the wavelength of interest, the thickness of the III-nitride layer is adjusted.

In some embodiments, the PhC-GEMM structures of the present invention provide large tunable peak reflectivity and reflectivity bandwidths and substantial angle independence. In addition to tunable high reflectivity, the PhC-GEMM is also substantially lattice-matched to GaN and can also be made electrically conductive by impurity doping the GaN such that current injection layers are not required when the PhC-GEMM is integrated with an optical or electrical device In some embodiments, the PhC-GEMM is grown epitaxially in a single growth system.

FIG. 1A is a block diagram of a two-layer metallo-semiconductor structure 101, according to some embodiments of the present invention. In some embodiments, metallo-semiconductor structure 101 includes substrate 111 (e.g., Si, GaN, sapphire, GaN-on-Sapphire, GaN-on-Si, AlN, AlN-on-sapphire, AlN-on-Si and/or the like as described above), metal material layer 112 (e.g., elemental metals, composites, and/or compounds that include Ti, Zr, Hf, V, Nb, Ta, Cr, Mo, W, and/or the like as described above) on substrate 111, and III-nitride layer 113 (e.g., GaN, AlN, Si, and/or the like as describe above) on metal material layer 112. In some embodiments, III-nitride layer 113 includes impurity doping (e.g., Si doping for n-type conductivity and Mg doping for p-type conductivity) to increase the electrical conductivity. In some embodiments, metal layer 112 and III-nitride layer 113 form a single period 110 PhC-GEMM structure for tuning the reflectivity of light incident on the structure.

In some embodiments, metallo-semiconductor structure 101 includes a plurality of periods 110 (e.g., up to 20 periods or as described above).

In some embodiments, the thickness of metal layer 112 is approximately 20 nm and the thickness of III-nitride layer 113 is approximately 90 nm. In some embodiments, substrate 111 is removed following the formation of the metallo-semiconductor structure.

In some embodiments, metallo-semiconductor structure 101 is used as an epitaxial growth template for a semiconductor device (e.g., LED, LD, VCSEL, sensor, transistor, and the like). In other embodiments, metallo-semiconductor structure 101 is integrated with a semiconductor device. In yet other embodiments, metallo-semiconductor structure 101 is provided on the light exiting surface of a light-emitting device (e.g., LED, LD, VCSEL or the like).

Figure 1B:
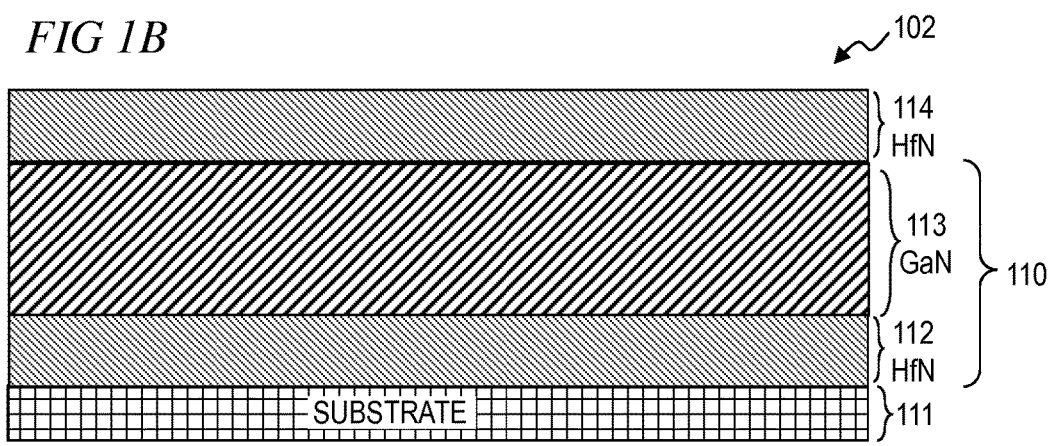
FIG. 1B is a block diagram of a multi-layer metallo-semiconductor structure 102, according to some embodiments of the present invention.

FIG. 1B is a block diagram of a multi-layer metallo-semiconductor structure 102, according to some embodiments of the present invention. In some embodiments, metallo-semiconductor structure 102 is substantially similar to metallo-semiconductor structure 101 described above and in FIG. 1A, except that metallo-semiconductor structure 102 is capped with an additional metal layer 114. In some embodiments, metal layer 114 has a thickness that is substantially similar to metal layer 112. In other embodiments, metal layer 114 has a thickness that is about 5 nm, or between about 5 nm and about 15 nm. In yet other embodiments, metal layer 114 has a thickness that is greater than metal layer 112. In some embodiments, metal layer 114 and metal layer 112 are formed from the same material. In other embodiments, metal layer 114 and metal layer 112 are formed from different materials. In some embodiments, metallo-semiconductor structure 102 includes a plurality of periods 110 (e.g., up to 20 periods or as described above).

Figure 1C:
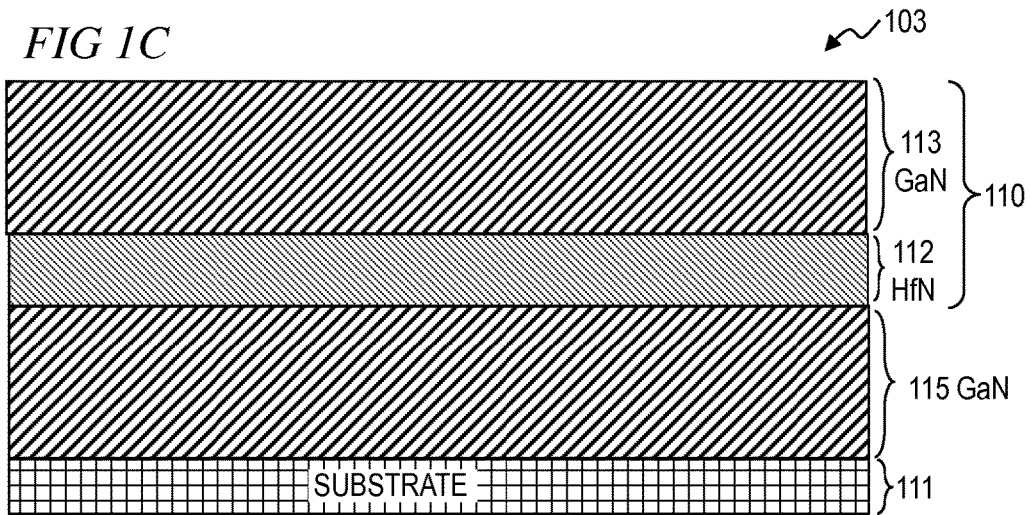
FIG. 1C is a block diagram of a multi-layer metallo-semiconductor structure 103, according to some embodiments of the present invention.

FIG. 1C is a block diagram of a multi-layer metallo-semiconductor structure 103, according to some embodiments of the present invention. In some embodiments, metallo-semiconductor structure 103 is substantially similar to metallo-semiconductor structure 101 described above and in FIG. 1A, except that metallo-semiconductor structure 103 includes an additional III-nitride layer 115 between substrate 111 and the metal layer 112 of period 110. In some embodiments, III-nitride layer 115 has a thickness that is substantially similar to III-nitride layer 113. In other embodiments, III-nitride layer 115 has a thickness that is about 5 nm, or between about 5 nm and about 20 nm, or between about 20 nm and about 50 nm, or between about 50 nm and about 100 nm, or between about 100 nm and about 500 nm, or between about 500 nm and about 1,000 nm, or between about 1 μm and about 2 μm, or between about 2 μm and about 3 μm, or between about 3 μm and about 5 μm. In yet other embodiments, III-nitride layer 115 has a thickness that is greater than III-nitride layer 113. In some embodiments, III-nitride layer 115 and III-nitride layer 113 are formed from the same material. In other embodiments, III-nitride layer 115 and III-nitride layer 113 are formed from different materials. In some embodiments, metallo-semiconductor structure 103 includes a plurality of periods 110 (e.g., up to 20 periods or as described above). In some embodiments, III-nitride layer 115 includes impurity doping to increase the electrical conductivity.

Figure 2A:
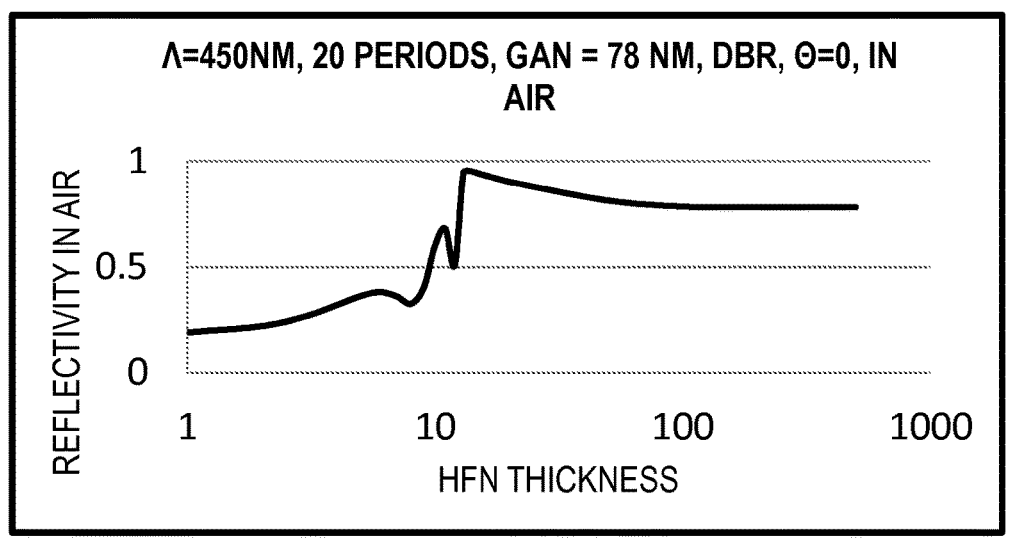
FIG. 2A is a plot 201 showing a simulated reflectivity curve for a multi-layer metallo-semiconductor structure as a function of the HfN layer thickness, according to some embodiments of the present invention.

FIG. 2A is a plot 201 showing a simulated reflectivity curve for a multi-layer metallo-semiconductor structure as a function of the HfN layer thickness, according to some embodiments of the present invention. Plot 201 illustrates the effect of HfN thickness on reflectivity for a 20 period HfN—GaN metallo-semiconductor structure at a wavelength of 450 nm and a fixed GaN thickness of 78 nm. The peak of the reflectivity at a wavelength of 450 nm occurs at a HfN thickness of approximately 15 nm and when the HfN thickness is greater than approximately 90 nm, the reflectivity takes on the HfN bulk reflectivity value of approximately 70% at 450 nm.

Figure 2B:
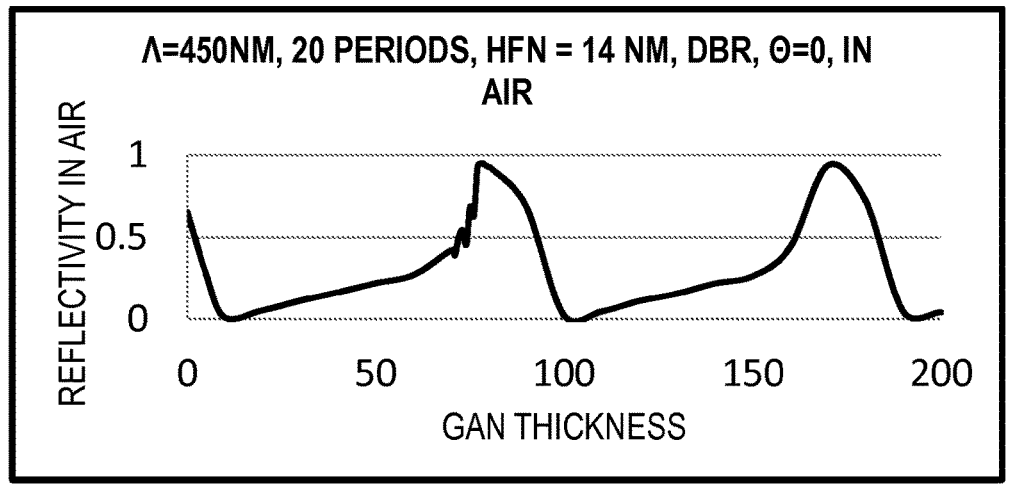
FIG. 2B is a plot 202 showing a simulated reflectivity curve for a multi-layer metallo-semiconductor structure as a function of GaN layer thickness, according to some embodiments of the present invention.

FIG. 2B is a plot 202 showing a simulated reflectivity curve for a multi-layer metallo-semiconductor structure as a function of GaN layer thickness, according to some embodiments of the present invention. Plot 202 illustrates the effect of GaN thickness on reflectivity for a 20 period HfN—GaN metallo-semiconductor structure at a wavelength of 450 nm and a fixed HfN thickness of 14 nm. The peak of the reflectivity at a wavelength of 450 nm occurs at GaN thicknesses that are approximately integral multiples of the half wavelength of 450 nm light in GaN (e.g., approximately 80 nm and approximately 160 nm) as shown in plot 202.

Figure 2C:
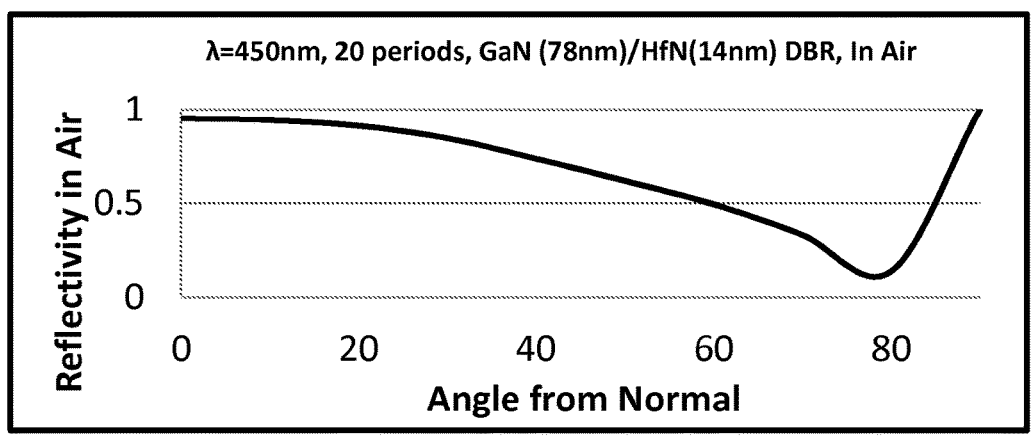
FIG. 2C is a plot 203 showing a simulated reflectivity curve for a multi-layer metallo-semiconductor structure as a function of incident angle from normal, according to some embodiments of the present invention.

FIG. 2C is a plot 203 showing a simulated reflectivity curve for a multi-layer metallo-semiconductor structure as a function of the incident lights incident angle from normal, according to some embodiments of the present invention. Plot 203 illustrates the effect of the incident light's varying angle of incidence (from 0 degrees to 90 degrees) on reflectivity for a 20 period HfN—GaN metallo-semiconductor structure at a wavelength of 450 nm and for HfN having a thickness of 14 nm and GaN having a thickness of 78 nm.

Figure 2D:
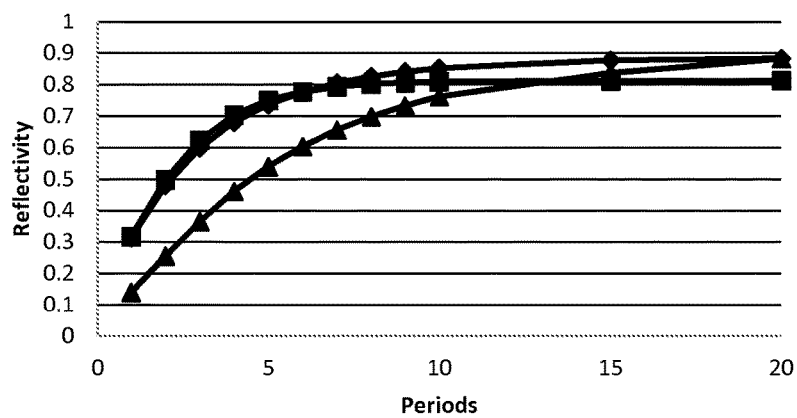
FIG. 2D is a plot 204 showing a simulated reflectivity curve for a multi-layer metallo-semiconductor structure as a function of the number of periods in the metallo-semiconductor structure, according to some embodiments of the present invention.

FIG. 2D is a plot 204 showing various simulated reflectivity curves for three multi-layer metallo-semiconductor structures as a function of the number of periods in the metallo-semiconductor structure, according to some embodiments of the present invention. Plot 204 illustrates the effect of the number of HfN—GaN periods on the reflectivity for three different HfN—GaN metallo-semiconductor structures. The reflectivity is calculated at a wavelength of 450 nm for the three structures. For two of the structures, the reflectivity reaches a maximum after just eight (8) periods, whereas the third structure requires over 20 periods.

Figure 2E:
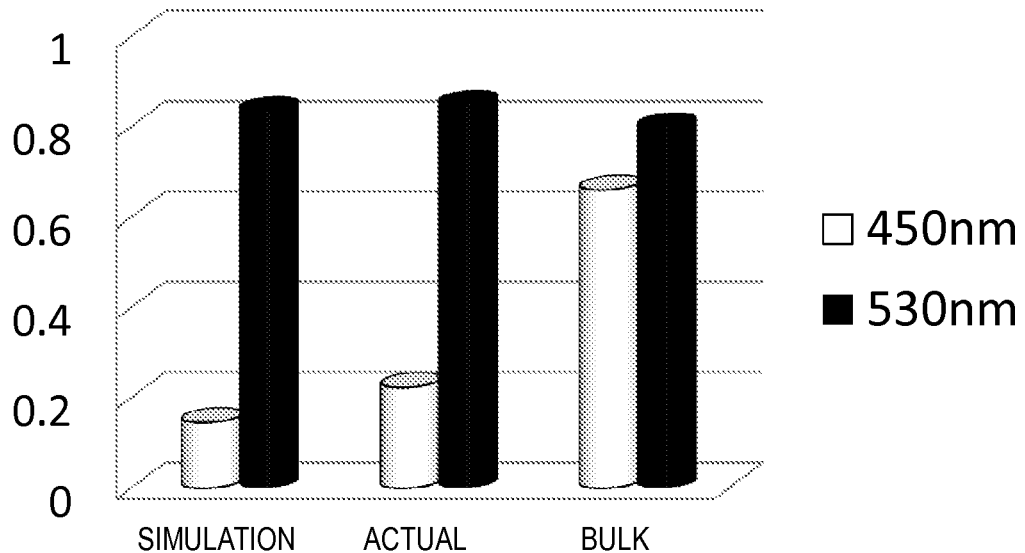
FIG. 2E is a plot 205 showing simulated and actual reflectivity data for a four-period metallo-semiconductor structure, according to some embodiments of the present invention.

FIG. 2E is a plot 205 showing simulated and actual reflectivity data for a four-period metallo-semiconductor structure (i.e., HfN/AlN) at two wavelengths (i.e., 450 nm and 530 nm), according to some embodiments of the present invention. Plot 205 illustrates the good agreement between simulated reflectivity data and actual measured data from fabricated four-period HfN/AlN structures. The measured reflectivity data for bulk HfN (i.e., HfN with a thickness of approximately 300 nm) is provided for comparison.

Figure 2F:
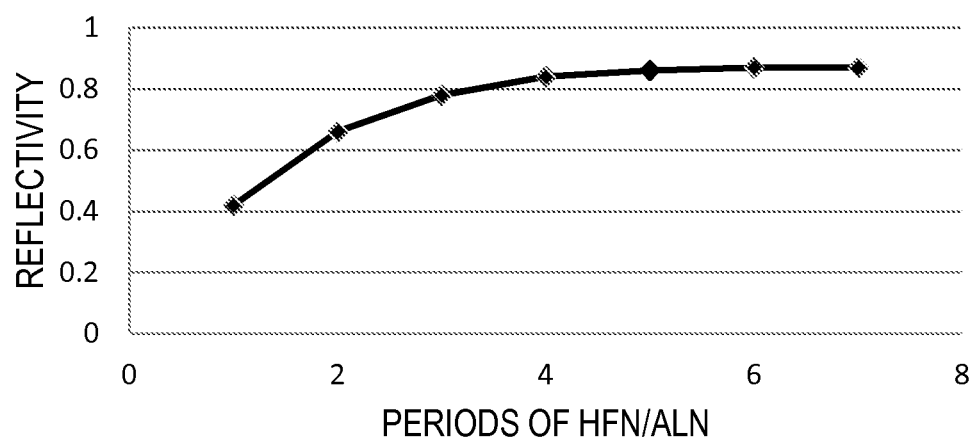
FIG. 2F is a plot 206 showing a simulated reflectivity curve for a multi-layer metallo-semiconductor structure as a function of the number of periods of the HfN/AlN layer structure, according to some embodiments of the present invention.

FIG. 2F is a plot 206 showing a simulated reflectivity curve, at 530 nm wavelength, for a multi-layer metallo-semiconductor structure (i.e., HfN/AlN) as a function of the number of periods of the HfN/AlN layer structure, according to some embodiments of the present invention. Plot 206 illustrates the effect of the number of HfN—AlN periods on the reflectivity at a wavelength of 530 nm for a HfN—AlN metallo-semiconductor structure. For this HfN—AlN structure, the reflectivity reaches a maximum after just five (5) periods.

Figure 2G:
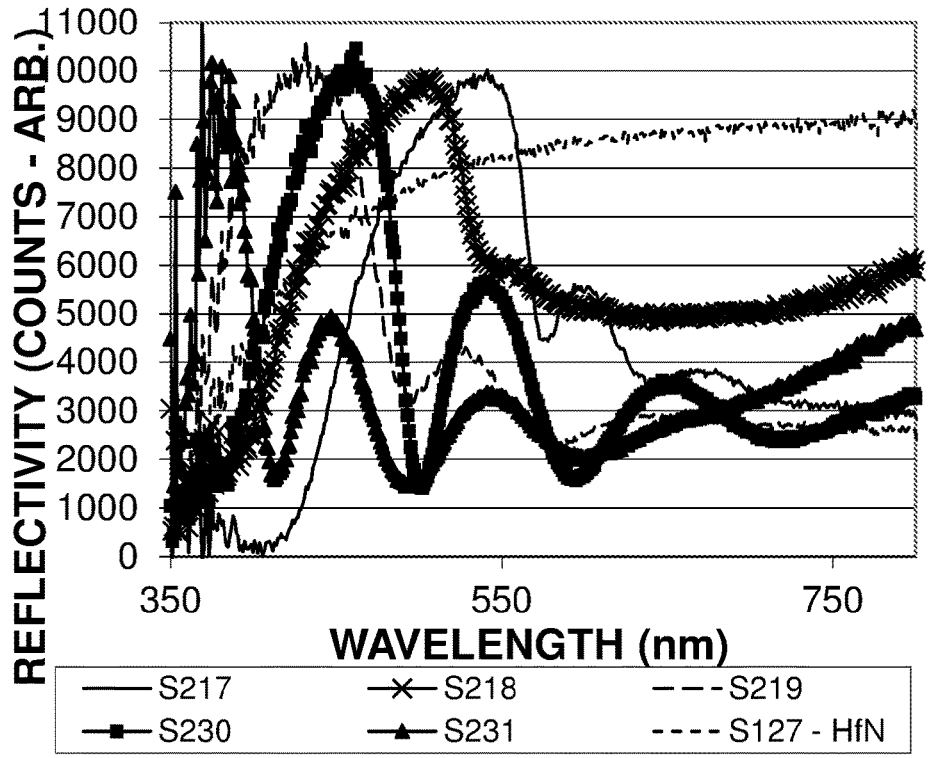
FIG. 2G is a plot 207 showing measured reflectivity curves for a multi-layer metallo-semiconductor structure as a function of the incident wavelength of light, according to some embodiments of the present invention.

FIG. 2G is a plot 207 showing a plurality of measured reflectivity curves for various multi-layer metallo-semiconductor (i.e., HfN/AlN) structures as a function of the incident wavelength of light, according to some embodiments of the present invention. Plot 207 illustrates the ability to "tune" the reflectivity of the mirror to achieve high peak reflectivity at a desired wavelength by modifying the thickness of the HfN and AlN layers.

Figure 2H:
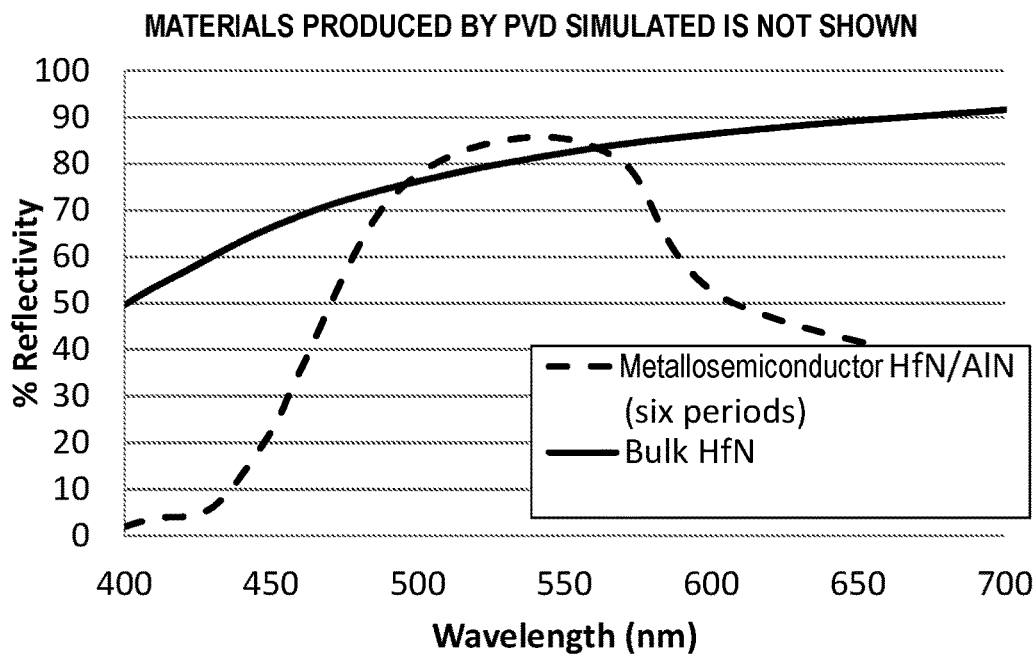
FIG. 2H is a plot 208 showing a measured reflectivity curve for a bulk HfN mirror and for a multi-layer metallo-semiconductor structure as a function of the incident wavelength of light, according to some embodiments of the present invention.

FIG. 2H is a plot 208 showing measured reflectivity curves for a bulk HfN mirror and a multi-layer metallo-semiconductor structure as a function of the incident wavelength of light, according to some embodiments of the present invention. Plot 208 illustrates the comparison between bulk HfN mirrors (i.e., a single thick HfN layer approximately 300 nm thick) and a HfN—AlN metallo-semiconductor structure (i.e., PhC-GEMM) that includes six HfN—AlN periods of 17 nm of HfN alternating with 120 nm of AlN, epitaxially grown on a GaN/Sapphire, where the GaN has a thickness of approximately 5 µm. As shown in FIG. 2H, the multi-layer metallo-semiconductor structure is designed such that the bandwidth of the peak reflectivity is increased.

Figure 3:
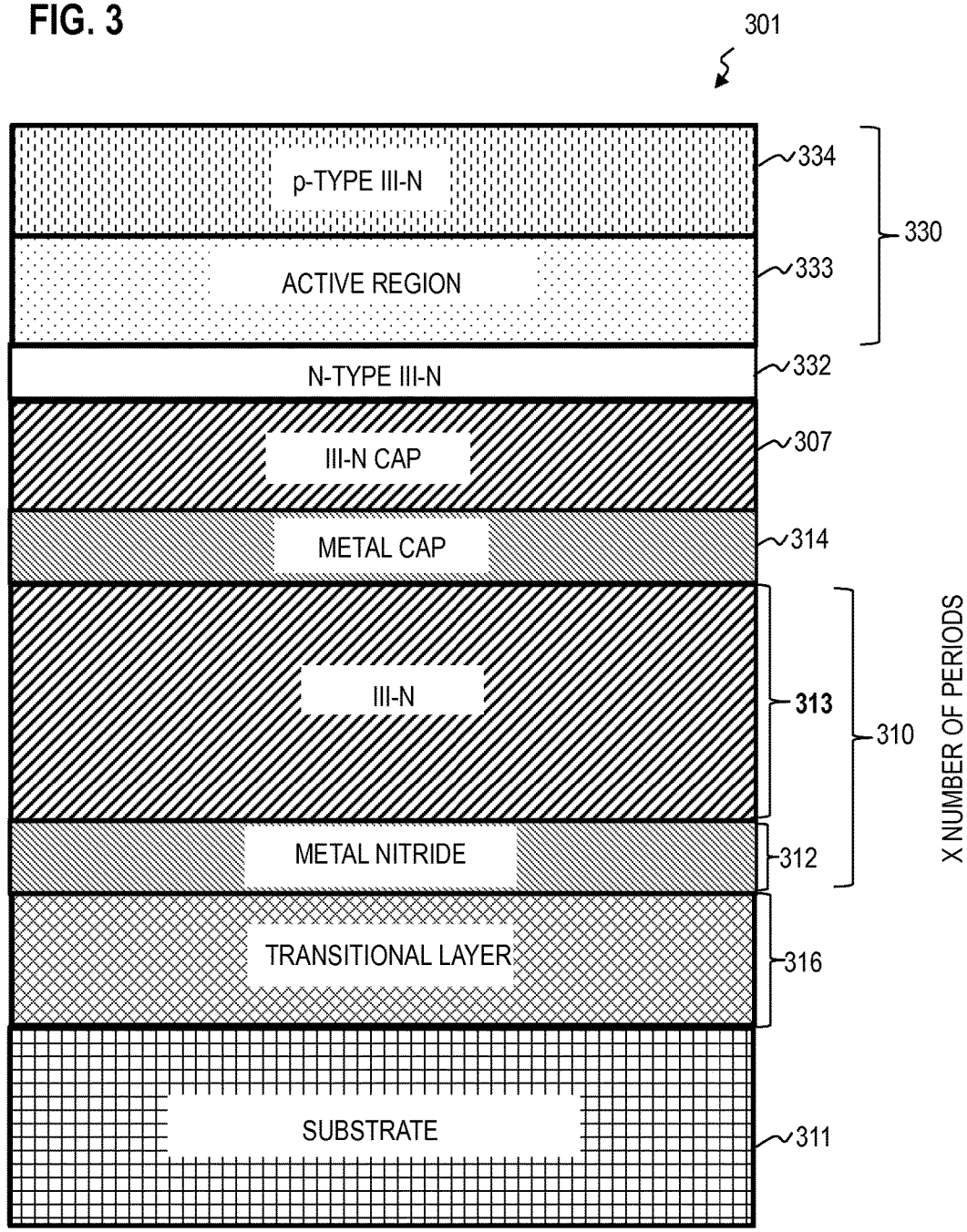
FIG. 3 is a block diagram of semiconductor device structure 301 that includes a multi-layer metallo-semiconductor structure, according to some embodiments of the present invention.

FIG. 3 is a block diagram of semiconductor device structure 301 that includes a multi-layer metallo-semiconductor structure (i.e., PhC-GEMM), according to some embodiments of the present invention. In some embodiments, semiconductor device structure 301 includes substrate 311 (e.g., Si, GaN, sapphire, GaN-on-Sapphire, GaN-on-Si, AlN, AlN-on-sapphire, AlN-on-Si and/or the like as described above), transition layer 316 (e.g., that includes a III-nitride layer or a metal material, each of which are described above) on substrate 311, metal material layer 312 (e.g., elemental metals, composites, and/or compounds that include Ti, Zr, Hf, V, Nb, Ta, Cr, Mo, W, and/or the like as described above) on transition layer 316, III-nitride layer 313 (e.g., GaN, AlN, Si, and/or the like as describe above) on metal material layer 312, wherein metal material layer 312 and III-nitride layer 313 form a single period 310 PhC-GEMM structure, metal cap layer 314 (e.g., that includes a metal material as described above) on PhC-GEMM period 310, III-nitride cap 331 (e.g., that includes a III-nitride material as described above) on metal cap layer 314, and semiconductor device structure 330.

In some embodiments, transition layer 316, III-nitride layer 313, and III-nitride cap 331 include impurity doping (e.g., Si doping for n-type conductivity and Mg doping for p-type conductivity) to increase the electrical conductivity.

In some embodiments, metal layer 312 and III-nitride layer 313 form a single period 310 PhC-GEMM structure for tuning the reflectivity of light incident on the structure. Optionally, in some embodiments, semiconductor device 301 includes a plurality of periods 310 (e.g., up to 20 periods or as described above).

In some embodiments, the thickness of metal layer 312 is approximately 20 nm and the thickness of III-nitride layer 313 is approximately 90 nm. In some embodiments, substrate 311 is removed following the formation of the semiconductor device structure 330.

In some embodiments, semiconductor device structure 330 is an LED device structure and includes n-type III-nitride layer 332, active region 333 located on n-type III-nitride layer 332, and p-type III-nitride layer 334 located on active region 333. In some embodiments, active region 333 includes one or more light emitting quantum wells (e.g., InGaN quantum wells (QWs) or multiple-quantum wells (MQW's)).

In some embodiments, transition layer 316, and/or metal cap layer 314, and/or III-nitride cap layer 331 are optional. In other embodiments, one or more of the optional layers (i.e., transition layer 316, metal cap layer 314, and III-nitride cap layer 331) are included in semiconductor device structure 330 as described above.

In some embodiments, substrate 311, transition layer 316, metal material layer 312, III-nitride layer 313, metal cap layer 314, III-nitride cap 331, and semiconductor device structure 330 are each substantially single crystal and substantially lattice matched to each previous and subsequent layer.

Figure 4A:
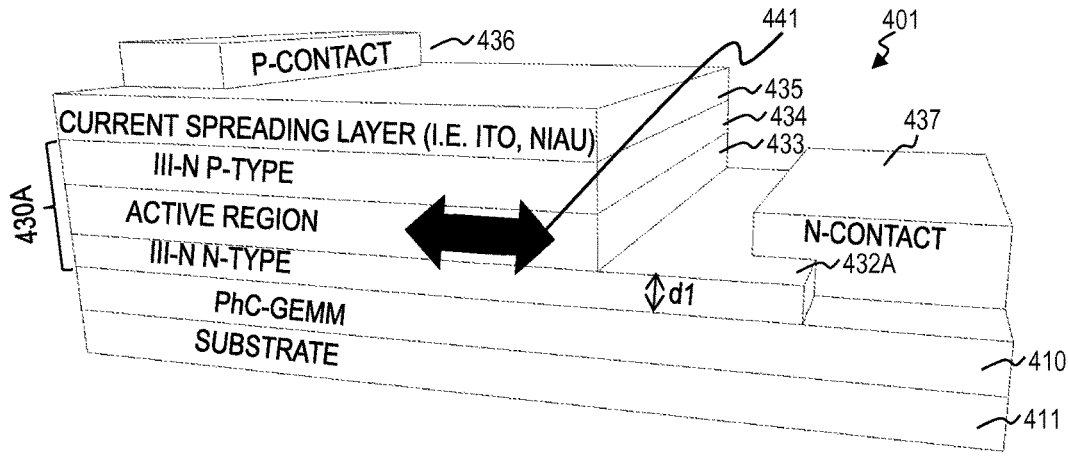
FIG. 4A is a perspective drawing of LED 401 that includes a multi-layer metallo-semiconductor structure, according to some embodiments of the present invention.

FIG. 4A is a perspective drawing of LED 401 that includes a multi-layer metallo-semiconductor structure, according to some embodiments of the present invention. In some embodiments, LED 401 includes substrate 411, PhC-GEMM structure 410 on substrate 411, LED device structure 430A on PhC-GEMM structure 410, and current spreading layer 435 on LED device structure 430A. In some embodiments, LED device structure 430A includes n-type III-nitride layer 432A on PhC-GEMM structure 410, active region 433 on n-type III-nitride layer 432A, and p-type III-nitride layer 434 between active region 433 and current spreading layer 435. LED 401 further includes n-contact metal 437 in electrical contact with PhC-GEMM structure 410 and p-contact metal 436 in electrical contact with current spreading layer 435.

In some embodiments, active region 433 includes one or more light emitting quantum wells (e.g., InGaN quantum wells (QWs) or multiple quantum wells (MQWs)). In some embodiments, n-contact metal 437 and p-contact metal include standard metallization materials and structures well known by those with skill in the arts.

In some embodiments, n-type III-nitride layer 432A is designed to have a thickness, d1, such that $d1=m^*\lambda_o/(2^*n)$, where m is an integer, n is the index of refraction of the III-nitride, $\lambda_o/n$ is the wavelength of generated light in the semiconductor used as a unit of measure perpendicular to the GEMM layer, $\lambda_o$ is the wavelength of the light in vacuum, and PD is the optical penetration depth of the light into a GEMM layer if the thickness of the GEMM layer is greater than the penetration depth otherwise PD is the optical length of the GEMM layer. In some embodiments, d1 is a periodic integer with integer multiples of $\lambda_o/(2^*n)$ distance away from the first GEMM layer in the PhC-GEMM structure, minus the thickness of the first GEMM layer or the penetration depth of the light into the GEMM layer if the thickness of the first GEMM layer is greater than the penetration depth. In some such embodiments, the light emitted by LED 401 will include optical modes 441 whose direction is parallel to the top surface of substrate 411.

In some embodiments, LED 401 includes a top surface (i.e., the planar surface of current spreading layer 435 opposite p-type III-nitride layer 434) that is flat or roughened/textured, and/or includes ordered patterns (e.g., pyramids), non-ordered patterns, photonic lattice/crystal structures, reflective materials, metal, a DBR, and/or combinations thereof, and/or the like.

Figure 4B:
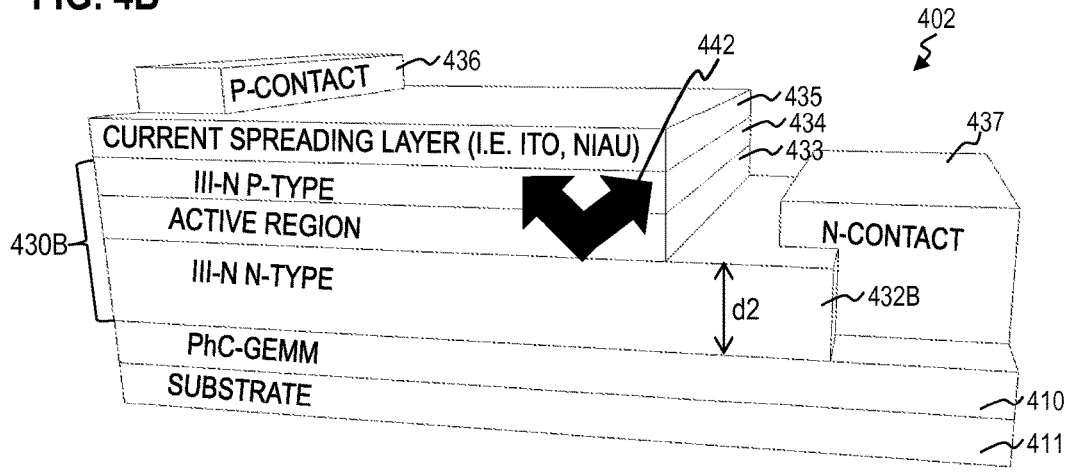
FIG. 4B is a perspective drawing of LED 402 that includes a multi-layer metallo-semiconductor structure, according to some embodiments of the present invention.

FIG. 4B is a perspective drawing of LED 402 that includes a multi-layer metallo-semiconductor structure, according to some embodiments of the present invention. In some embodiments, LED 402 is substantially similar to LED 401 described above and in FIG. 4A, except that LED 402 includes LED device structure 430B on PhC-GEMM structure 410 and LED device structure 430B includes n-type III-nitride layer 432B on PhC-GEMM structure 410, active region 433 on n-type III-nitride layer 432B, and p-type III-nitride layer 434 between active region 433 and current spreading layer 435.

In some embodiments, n-type III-nitride layer 432B is designed to have a thickness, d2, such that $d2=m*\lambda_o/(4*n)+\lambda_o/(8*n)$, where m is an integer, n is the index of refraction of the III-nitride, $\lambda_o/n$ is the wavelength of generated light in the semiconductor used as a unit of measure perpendicular to the GEMM layer, $\lambda_o$ is the wavelength of the light in vacuum, and PD is the optical penetration depth of the light into a GEMM layer if the thickness of the GEMM layer is greater than the penetration depth otherwise PD is the optical length of the GEMM layer. In some embodiments, d2 is periodic integer with multiples of $\lambda_o/(2*n)$ starting at $\lambda_o/(8*n)$ away from the first GEMM layer minus the thickness of the thin GEMM layer or the penetration depth of the light into the GEMM layer if the thickness of the first GEMM layer is greater than the penetration depth. In some such embodiments, the light emitted by LED 402 will include optical modes 442 whose direction is at a 45 degree angle to the top surface of substrate 411.

Figure 4C:
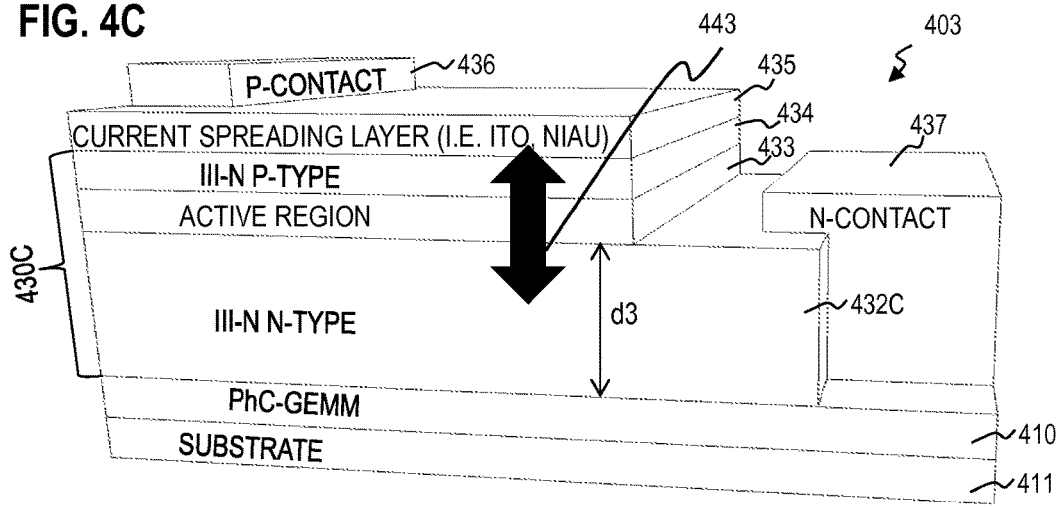
FIG. 4C is a perspective drawing of a LED 403 that includes a multi-layer metallo-semiconductor structure, according to some embodiments of the present invention.

FIG. 4C is a perspective drawing of LED 403 that includes a multi-layer metallo-semiconductor structure, according to some embodiments of the present invention. In some embodiments, LED 403 is substantially similar to LED 401 described above and in FIG. 4A, except that LED 403 includes LED device structure 430C on PhC-GEMM structure 410 and LED device structure 430C includes n-type III-nitride layer 432C on PhC-GEMM structure 410, active region 433 on n-type III-nitride layer 432C, and p-type III-nitride layer 434 between active region 433 and current spreading layer 435.

In some embodiments, n-type III-nitride layer 432C is designed to have a thickness, d3, such that $d3=m*\lambda_o/(2*n)+\lambda_o/(4*n)$, where m is an integer, n is the index of refraction of the III-nitride, $\lambda_o/2$ is the wavelength of generated light in the semiconductor used as a unit of measure perpendicular to the GEMM layer, $\lambda_o$ is the wavelength of the light in vacuum, and PD is the optical penetration depth of the light into a GEMM layer if the thickness of the GEMM layer is greater than the penetration depth otherwise PD is the optical length of the GEMM layer. In some embodiments, d3 is periodic integer with multiples of $\lambda_o/(2*n)$ starting at $\lambda_o/(4*n)$ away from the first GEMM layer minus the thickness of the thin GEMM layer or the penetration depth of the light into the GEMM layer if the thickness of the first GEMM layer is greater than the penetration depth. In some such embodiments, the light emitted by LED 403 will include optical modes 443 whose direction is perpendicular to the top surface of substrate 411.

In some embodiments, LED 401, LED 402, and LED 403 are combined with a blue-pass mirror, as described above, to prevent white light generated by an integrated phosphor doped material from entering the LED device.

Figure 5:
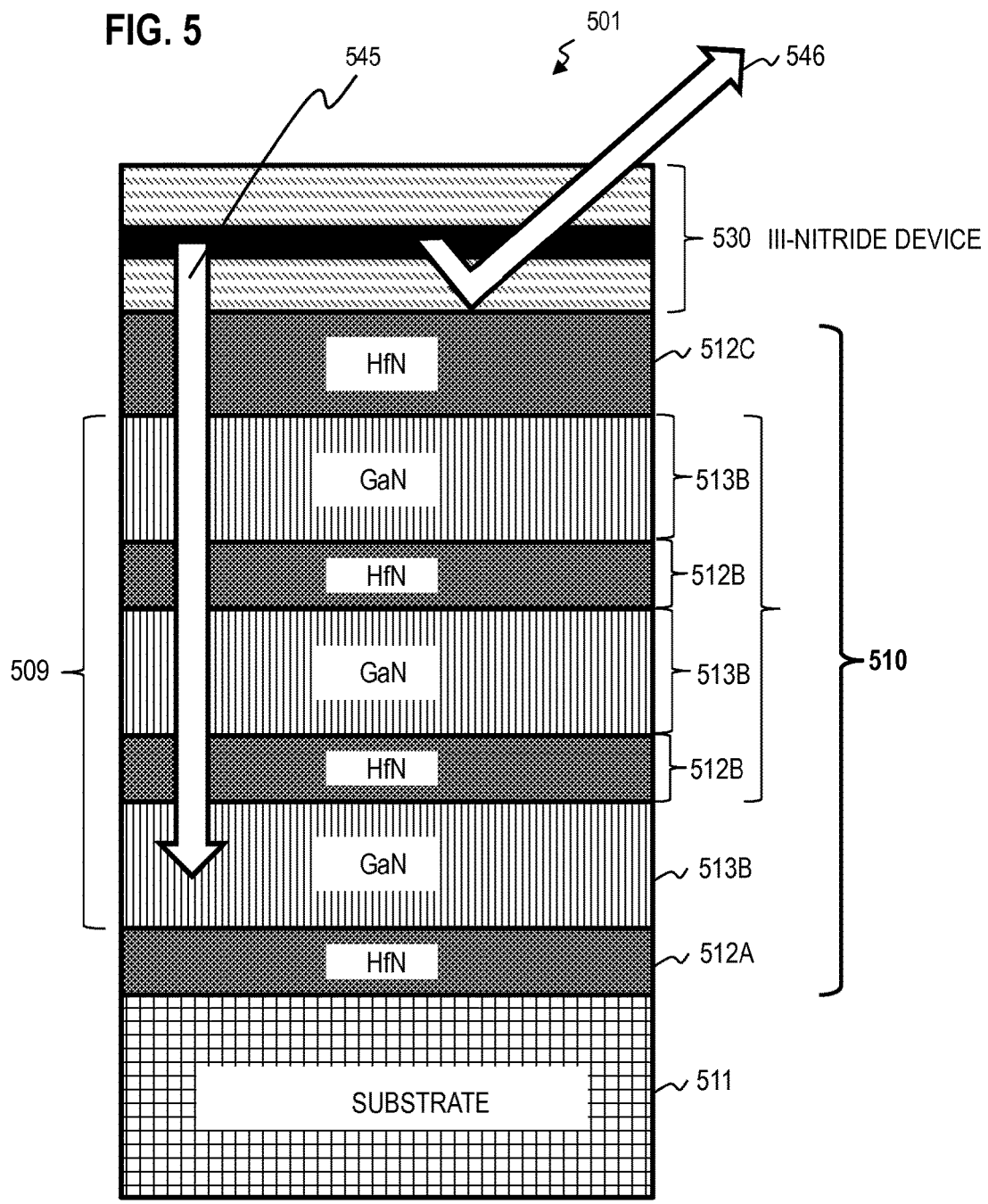
FIG. 5 is a block diagram of LED 501 that includes a multi-layer metallo-semiconductor structure in combination with a thick bulk metallic layer, according to some embodiments of the present invention.

FIG. 5 is a block diagram of semiconductor device structure 501 that includes a multi-layer metallo-semiconductor structure (i.e., PhC-GEMM structure 510) in combination with a thick bulk metallic layer (i.e., top HfN layer 512C), according to some embodiments of the present invention. In some embodiments, semiconductor device structure 501 includes substrate 511, PhC-GEMM structure 510 on substrate 511, and III-nitride device structure 530 on PhC-GEMM structure 510. In some embodiments, PhC-GEMM structure 510 includes bottom HfN layer 512A on top of substrate 511, period structure 509 that includes one or more periods of alternating layers of GaN layer 513B and HfN layer 512B on bottom HfN layer 512A (e.g., two-and-one-half periods as shown in FIG. 5, such that the one or more periods begins with a GaN layer 513B and end with a GaN layer 513B), and top HfN layer 512C on period structure 509.

In some embodiments, the thickness of top HfN layer 512C is selected such that top HfN layer 512C is substantially transparent to perpendicular light 545 (i.e., light that is traveling in a direction that is perpendicular to a plane defined by the top surface of the top HfN layer 512C) in order that the perpendicular light 545 interacts with and reflects from the underlying period structure 509 of the PhC-GEMM structure 510. In some such embodiments, off-axis light 546 (i.e., light that is traveling in a direction that away from an axis that is perpendicular to a plane defined by the top surface of the top HfN layer 512C) is substantially reflected by top HfN layer 512C such that guided modes are prevented from being absorbed in the underlying period structure 509 of the PhC-GEMM structure 510 because the path length of off-axis light 546 is longer than the path length of perpendicular light 545.

In some embodiments, top HfN layer 512C is part of the PhC-GEMM structure 510 and is designed to tune the optical reflectivity spectrum of the PhC-GEMM structure 510. In some embodiments, bottom HfN layer 512A has a thickness such that it is non-translucent (i.e., substantially opaque) to incident light.

Figure 6:
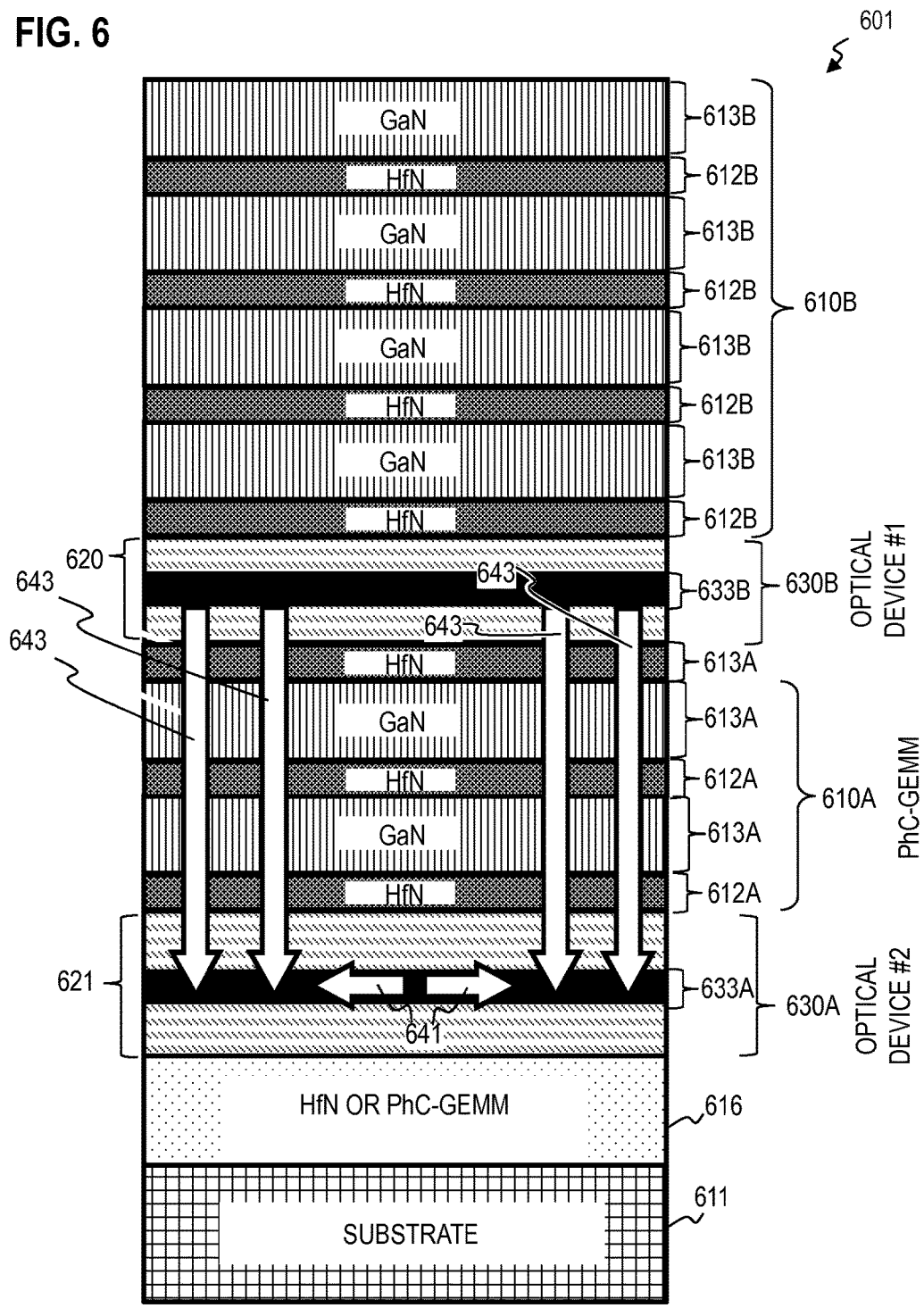
FIG. 6 is a block diagram of optically pumped semiconductor device structure 601 that includes a plurality of multi-layer metallo-semiconductor structures in combination with a plurality of quantum well regions, according to some embodiments of the present invention.

FIG. 6 is a block diagram of optically pumped semiconductor device structure 601 that includes a plurality of multi-layer metallo-semiconductor structures (i.e., first PhC-GEMM structure 610A and second PhC-GEMM structure 610B) in combination with a plurality of quantum well regions (i.e., first active region 633A and second active region 633B), according to some embodiments of the present invention. In some embodiments, semiconductor device structure 601 includes substrate 611, epitaxial mirror 616 on substrate 611, first optical device 630A on epitaxial mirror 616, first PhC-GEMM structure 610A on first optical device 630A, second optical device 630B on first PhC-GEMM structure 610A, and second PhC-GEMM structure 610B on second optical device 630B.

In some embodiments, first optical device 630A further includes first active region 633A that includes one or more quantum wells that generate parallel light 641 and second optical device 630B further includes second active region 633B that includes one or more quantum wells that generate perpendicular light 643. In some embodiments, first PhC-GEMM 610A includes one or more periods of alternating layers of HfN layer 612A and GaN layer 613A (e.g., two and one-half periods as shown in FIG. 6, such that both the first layer and the last layer of PhC-GEMM is HfN layer 512A), and second PhC-GEMM 610B includes one or more periods of alternating layers of HfN layer 512B and GaN layer 513B (e.g., four periods as shown in FIG. 6). In some embodiments, epitaxial mirror 616 includes a single GEMM layer or a PhC-GEMM structure as described herein.

In some embodiments, second active region 633B is electrically pumped and is positioned at an antinode of optical cavity 620, defined by the region between the top of first PhC-GEMM structure 610A (i.e., the interface between first PhC-GEMM structure 610A and second optical device 630B) and the bottom of second PhC-GEMM structure 610B (i.e., the interface between second PhC-GEMM structure 610B and second optical device 630B). In some embodiments, second active region 633B produces perpendicular light 643 that travels in a direction that is perpendicular to the top surface of substrate 612 such that perpendicular light 643 impinges on first active region 633A and optically pumps first active region 633A to produce parallel light 641. In some embodiments, perpendicular light 643 has a wavelength that is equal to or shorter than the wavelength of parallel light 641 such that the optical energy of perpendicular light 643 is equal to or greater than the energy bandgap of the one or more quantum wells in first active region 633A in order to efficiently optically pump the first active region 633A. In some embodiments, first active region 633A is positioned at a node of cavity 621.

In some embodiments, first optical device 630A is a metal clad laser, or a super-luminescent LED. In some embodiments, the second optical device is a light emitting diode or a vertical cavity surface emitting laser (VCSEL).

FIG. 7 is a block diagram of III-nitride substrate structure 701 that includes a sacrificial metallic layer, according to some embodiments of the present invention. In some embodiments, III-nitride substrate structure 701 includes substrate 711, sacrificial epitaxial metal layer 716 on substrate 711, and III-nitride layer 722 on sacrificial epitaxial metal layer 716. In some embodiments, III-nitride layer 722 includes GaN and is grown on sacrificial epitaxial metal layer 716 using any of the epitaxial growth techniques described above.

In some embodiments, sacrificial epitaxial metal layer 716 includes HfN and is sacrificially partially etched or fully etched, thereby leaving the III-nitride layer 722 available for further processing. In some embodiments, partial etching of sacrificial epitaxial metal layer 716 provides air gaps in sacrificial epitaxial metal layer 716 that function as a DBR structure. In some embodiments, III-nitride layer 722 is completely separated and removed from substrate 711 to form a free-standing III-nitride substrate upon which optical or electrical semiconductor devices are fabricated. In some embodiments, III-nitride layer 722 is completely separated and removed as a step in a flip-chip process. In some embodiments, sacrificial epitaxial metal layer 716 includes any metallic material described herein and in combination with any other metallic material described herein. In some embodiments, sacrificial epitaxial metal layer 716 includes more than one metallic material layer.

FIG. 8A is a block diagram of III-nitride growth template 801 that includes a 2-dimensional (2D) photonic-crystal (PhC) GEMM layer (i.e., 2D-PhC-GEMM 850), according to some embodiments of the present invention. In some embodiments, III-nitride growth template 801 includes substrate 811, 2D-PhC-GEMM 850 on substrate 811, and III-nitride layer 822 on 2D-PhC-GEMM 850.

FIG. 8B is a perspective drawing of 2D-PhC-GEMM layer 850, according to some embodiments of the present invention. In some embodiments, 2D-PhC-GEMM layer 850 includes GEMM layer 816 and a plurality of III-nitride regions 852. In some embodiments, GEMM layer 810 is patterned and etched through to form a plurality of etched-through regions and a new material, having an index of refraction that is different from the index of refraction of the GEMM layer 816, is epitaxially grown in the etched-through regions to form a plurality of III-nitride regions 852 to form a two-dimensional photonic-crystal GEMM (2D-PhC-GEMM layer) 850.

In some embodiments, GEMM layer 816 includes HfN and is patterned (e.g., with holes, lines, dots, and/or various geometries and the like) and etched through. GaN is then grown into the etched through regions of GEMM layer 816. In some embodiments, standard semiconductor processing methods are used to pattern and etch the GEMM layer 816. In some embodiments, for example, HfN 816 is grown on a substrate 811, HfN 816 is patterned and etched clear through, GaN 852 is grown in the etch through areas in the HfN 816, GaN 852 eventually grows thick enough and coalesces above the HfN layer 816. In some embodiments, any metallic material described herein can be used in place of and/or in combination with the HfN.

Figure 8C:
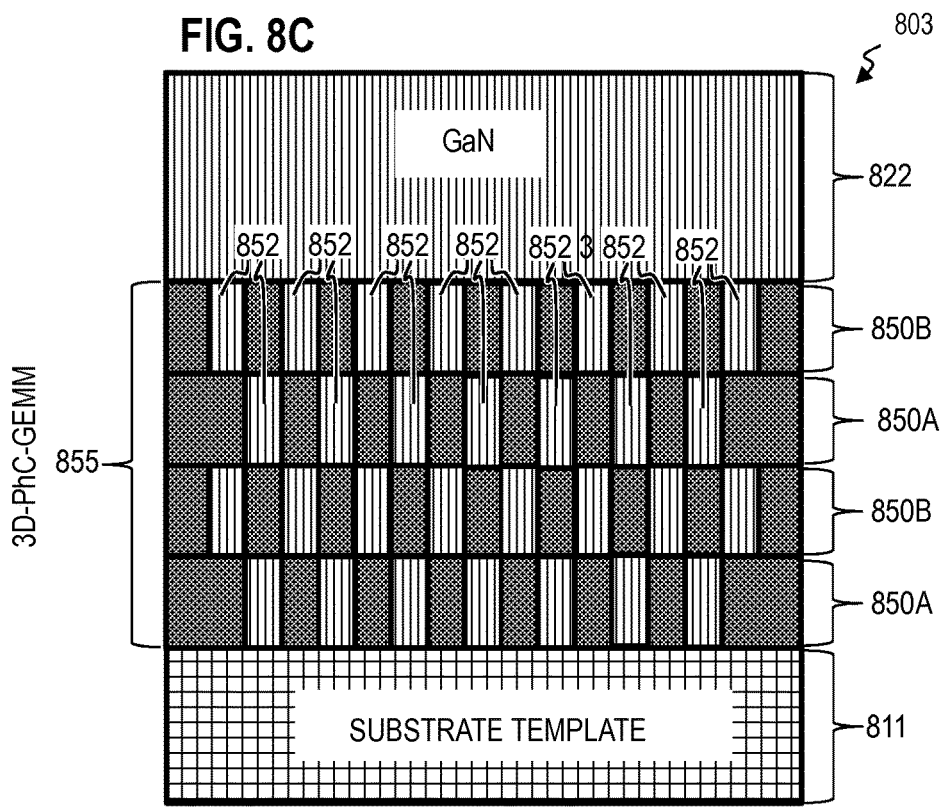
FIG. 8C is a perspective drawing of III-nitride growth template 803 that includes a 3-dimensional (3D) PhC-GEMM structure, according to some embodiments of the present invention.

FIG. 8C is a perspective drawing of III-nitride growth template 803 that includes a 3-dimensional (3D) PhC-GEMM structure, according to some embodiments of the present invention. In some embodiments, a plurality of 2D-PhC-GEMM layers is stacked on top of and the III-nitride regions are offset from one another to form a three-dimensional photonic-crystal GEMM (3D-PhC-GEMM) structure. In some embodiments, III-nitride growth template 803 includes substrate 811, 3D-PhC-GEMM structure 855 on substrate 811, and III-nitride layer 822 on 3D-PhC-GEMM structure 855.

In some embodiments, 3D-PhC-GEMM structure 855 includes a plurality of alternating 2D-PhC-GEMM layers (e.g., 2D-PhC-GEMM layer 250A and 2D-PhC-GEMM layer 250B), wherein 2D-PhC-GEMM layers 250A and 250B are substantially similar to 2D-PhC-GEMM layer 250 described above. However, in 3D-PhC-GEMM structure 855, the III-nitride regions 852 in 2D-PhC-GEMM layer 250B are off-set from the III-nitride regions 852 in 2D-PhC-GEMM layer 250A, as shown in FIG. 8C and FIG. 8D, such that the III-nitride regions 852 in layer 250A and layer 250B do not line up.

Figure 8D:
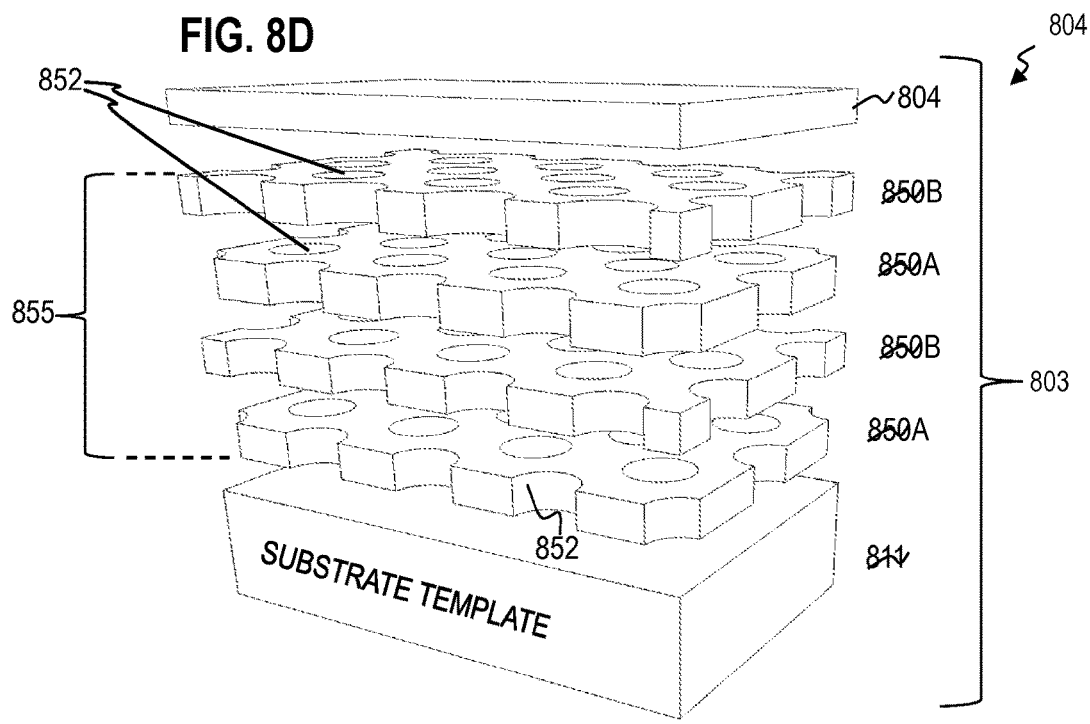
FIG. 8D is an exploded perspective drawing of 3D PhC-GEMM structure 804, according to some embodiments of the present invention, according to some embodiments of the present invention.

FIG. 8D is an exploded perspective drawing 804 of III-nitride growth template 803, according to some embodiments of the present invention, according to some embodiments of the present invention.

FIG. 9 is a block diagram of III-nitride tandem reflector growth template 901 that includes a plurality of PhC-GEMM structures (e.g., first PhC-GEMM structure 910A and second PhC-GEMM structure 910B), according to some embodiments of the present invention. In some embodiments, III-nitride tandem reflector growth template 901 includes substrate 911, first PhC-GEMM template 910A on substrate 911, and second PhC-GEMM template 910B on first PhC-GEMM template 910A. In some embodiments, first PhC-GEMM template 910A includes a plurality of alternating layers of HfN layer 912A and GaN layer 913A, and second PhC-GEMM template 910B includes a plurality of alternating layers of HfN layer 912B and GaN layer 912B.

In some embodiments, first PhC-GEMM structure 910A is reflective to 450 nm light but partially transparent to 460 nm light and second mirror PhC-GEMM structure 910B is reflective to 460 nm light. In some embodiments, the reflectivity spectrum of III-nitride tandem reflector growth template 901 is optimized for two wavelengths of incident light. In some embodiments, III-nitride tandem reflector growth template 901 further includes three or more PhC-GEMM structures such that the reflectivity spectrum of growth template 901 is optimized for three or more wavelengths of incident light.

Figure 10:
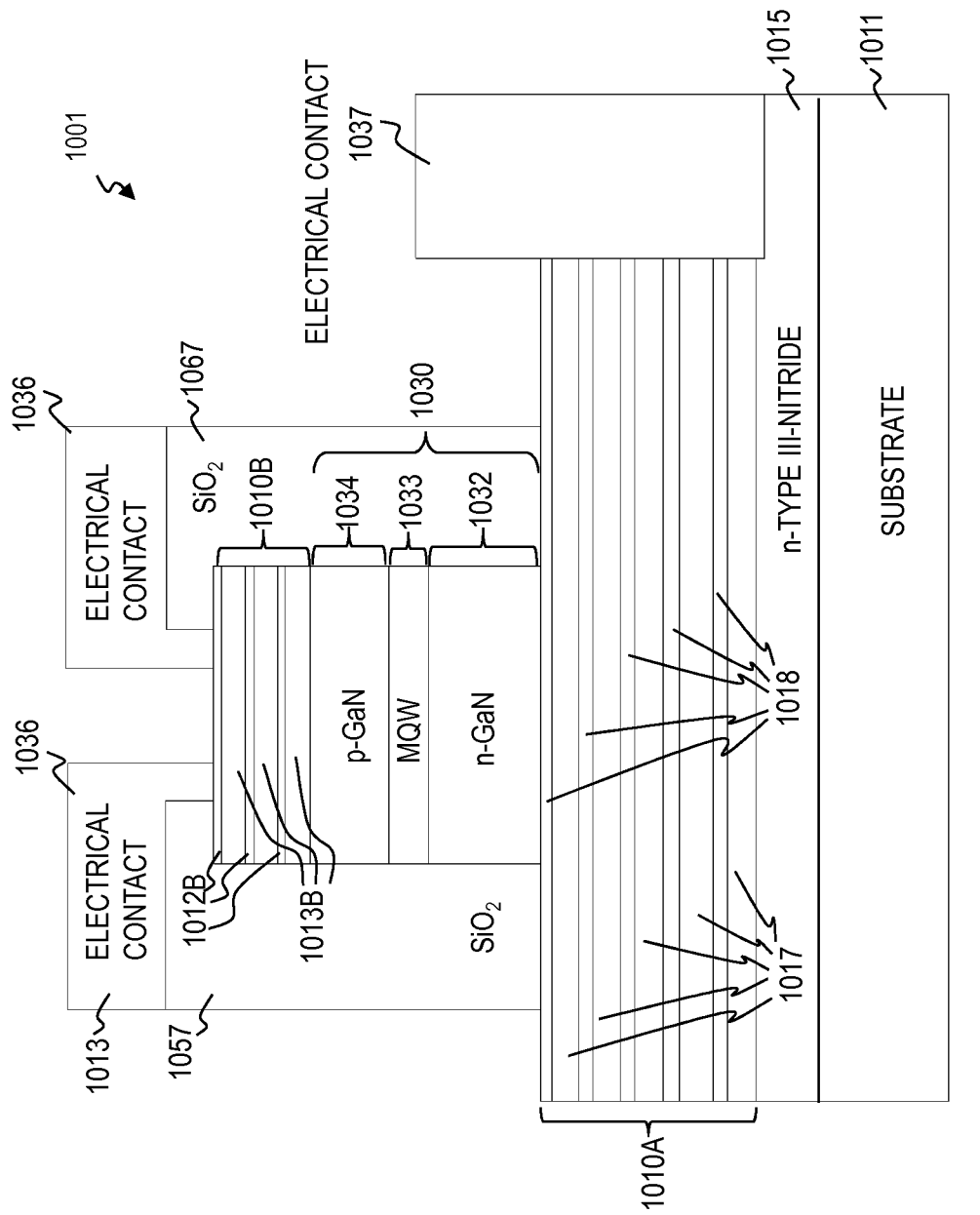
FIG. 10 is a perspective drawing of vertical-cavity surface-emitting laser (VCSEL) 1001 that includes a plurality of 1D PhC-GEMM structures, according to some embodiments of the present invention.

FIG. 10 is a perspective drawing of vertical-cavity surface-emitting laser (VCSEL) 1001 that includes a plurality of PhC-GEMM structures, according to some embodiments of the present invention. In some embodiments, VCSEL 1001 includes substrate 1011, n-type III-nitride layer 1015 on substrate 1011, bottom PhC-GEMM structure 1010A on n-type III-nitride layer 1015, light-generating structure 1030 on bottom PhC-GEMM structure 1010A, and top PhC-GEMM structure 1010B on light-generating structure 1030.

In some embodiments, bottom PhC-GEMM structure 1010A includes a plurality of alternating layers of metal material 1012A and III-nitride material 1013A and top PhC-GEMM structure 1010B includes a plurality of alternating layers of metal material 1012B and III-nitride material 1013B. In some embodiments, light-generating structure 1030 includes n-type III-nitride layer 1032, active region 1033 that include one or more light generating quantum wells, and p-type III-nitride layer 1034. In some embodiments, VCSEL 1001 further includes side-wall insulators 1057 that surrounds the side-wall of light-generating structure 1030 and top PhC-GEMM structure 1010B, and p-type contact 1036 in electrical contact with top PhC-GEMM structure 1010B and n-type contact 1037 in electrical contact with n-type III-nitride layer 1015.

In some embodiments, bottom PhC-GEMM structure 1010A is designed to be highly reflective (e.g., approximately 99.9% reflective) to blue light and top PhC-GEMM structure 1010B is designed to be partially transmissive (e.g., approximately 90-95% reflective) to blue light, such the VCSEL 1001 emits blue laser light. In some other embodiments, bottom PhC-GEMM structure 1010A is designed to be highly reflective (e.g., approximately 99.9% reflective) to green light and top PhC-GEMM structure 1010B is designed to be partially transmissive (e.g., approximately 90-95% reflective) to green light, such the VCSEL 1001 emits green laser light.

Figure 11:
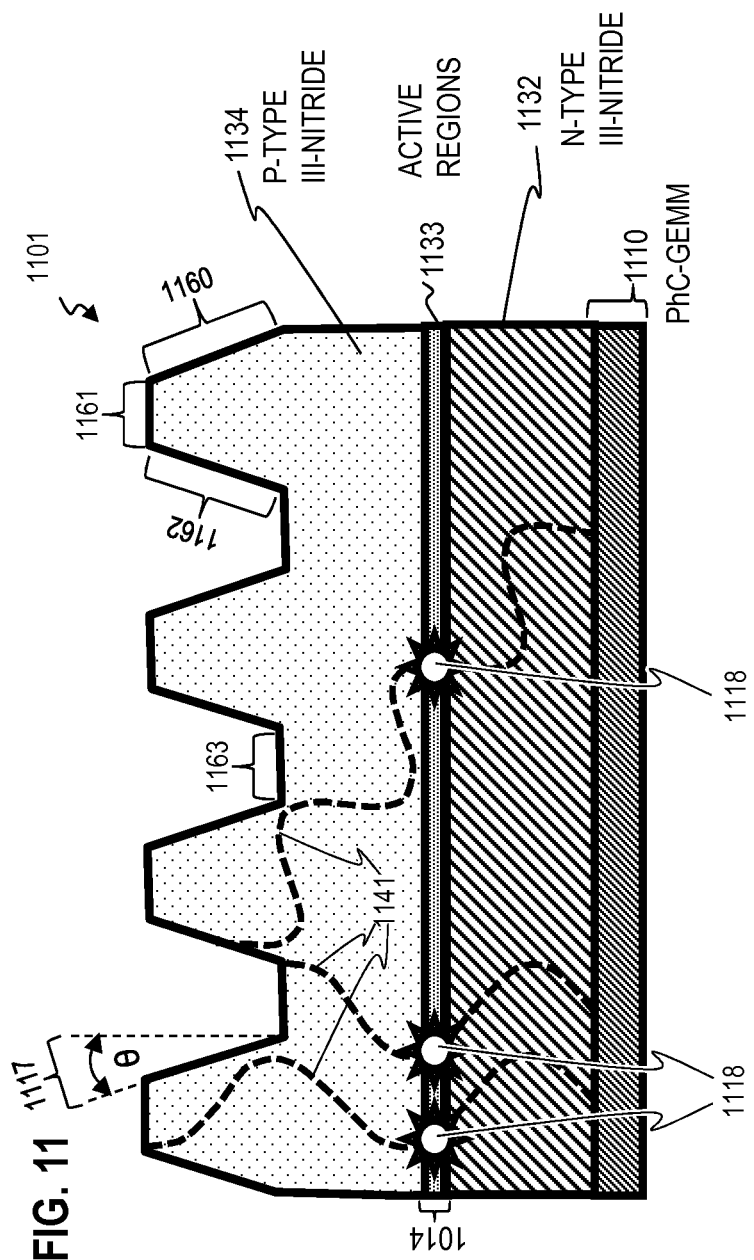
FIG. 11 is a block diagram of engineered light exiting surface 1101, according to some embodiments of the present invention.

FIG. 11 is a block diagram of engineered light exiting surface 1101, according to some embodiments of the present invention. In some embodiments, engineered light exiting surface 1101 includes PhC-GEMM structure 1110, n-type III-nitride layer 1132, active region 1133, and p-type III-nitride layer 1134. In some embodiments, p-type III-nitride layer 1134 is patterned and etched using standard semiconductor fabrication techniques and equipment to form an engineered light exiting surface. In some embodiments, engineered light exiting surface 1101 increases light extraction and substantially reduces or eliminates "trapped" guided modes in a direction that is parallel to the top surface of PhC-GEMM structure 1110. In some embodiments, engineered light exiting surface 1101 includes a structure as shown in FIG. 11. In some embodiments, engineered light exiting surface 1101 increases light extraction of emitted light 1140 due to the increased number of optical modes 1141 that will be within Snell's window when the emitted light 1140 impinges on the light exiting surfaces 1160, 1161, 1162, and 1163.

In some embodiments, light exits from surfaces 1160, 1161, 1162, and 1163. In some embodiments, exiting surfaces 1161 and 1163 have a width that is about 0 nm. In other embodiments, exiting surfaces 1161 and 1163 have a width that is greater than about 0 nm. In some embodiments, the width of exiting surfaces 1161 and the width of exiting surface 1163 are not equal. In some embodiments, exiting surfaces 1110 and 1112 each form an angle θ 1117 with an axis that is perpendicular to the top surface of PhC-GEMM structure 1110. In some embodiments, angle θ 1117 is about 0 degrees, or about 5 degrees, or about 10 degrees, or about 15 degrees, or about 20 degrees, or about 25 degrees, or about 30 degrees, or about 35 degrees, or about 40 degrees, or about 45 degrees, or about 50 degrees, or about 55 degrees, or about 60 degrees, or about 65 degrees, or about 70 degrees, or about 75 degrees, or about 80 degrees, or about 85 degrees, or about 90 degrees.

Dislocation Filter Technology

In some embodiments, the present invention includes materials, structures, and methods for improving the crystal quality of epitaxial materials grown on non-native substrates. For example, in some embodiments, the present invention provides a means for reducing the threading dislocation density of AlN epitaxial material grown on silicon (Si) substrates by using a dislocation filter to essentially "filter" out the dislocations using the dislocation filter structure. In some embodiments, a reduction in dislocation density is achieved by growing alternating of layers of epitaxial metal materials (e.g., HfN and as described above) and III-nitride materials (e.g., AlN and as described above). In some embodiments, it is believed that the material with the smaller lattice constant (e.g., AlN) is compressing the materials with the slightly larger lattice constant (e.g., HfN) such that dislocations are annihilated by reacting with other dislocations.

Figure 12:
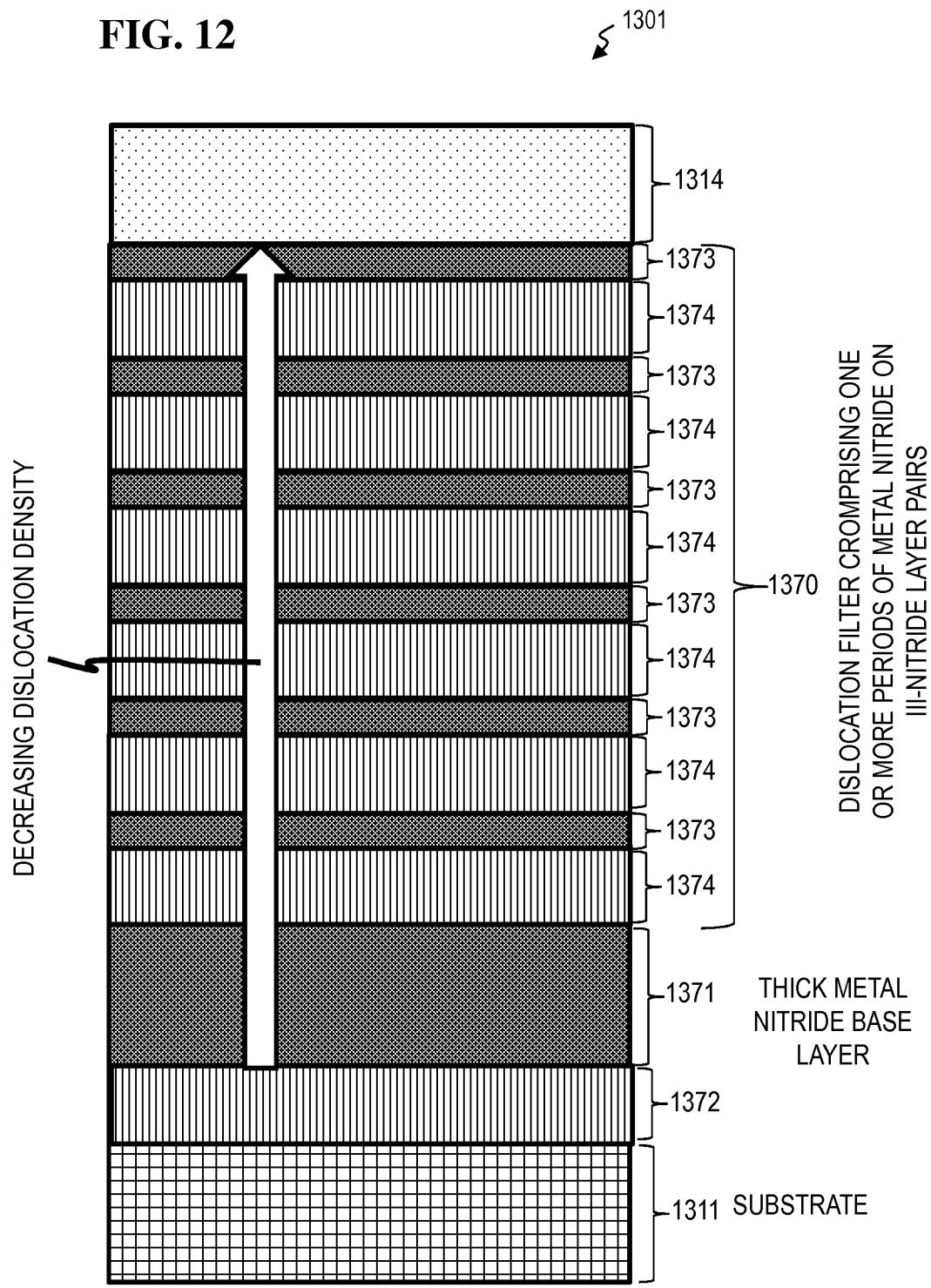
FIG. 12 is a block diagram of III-nitride dislocation filter growth template 1301, according to some embodiments of the present invention.

FIG. 12 is a block diagram of III-nitride dislocation filter growth template 1301, according to some embodiments of the present invention. In some embodiments, dislocation filter growth template 1301 includes substrate 1311 (as described above), III-nitride transition layer 1372 on substrate 1311, metal material base layer 1371 on III-nitride transition layer 1372, dislocation filter 1370 on metal material base layer 1371, and III-nitride capping layer 1314 on dislocation filter 1370. In some embodiments, dislocation filter 1370 includes one or more alternating layers of metal materials 1373 (e.g., HfN, ZrN, and/or the like as described above) and III-nitride materials 1374 (e.g., AlN, GaN, and/or the like as described above).

In some embodiments, substrate 1311 includes Si, III-nitride transition layer 1372 includes AlN having a thickness of between about 100 nm and about 2 microns, metal material base layer 1371 includes HfN having a thickness of about 100 nm to about 1 micron, and III-nitride capping layer 1314 includes AlN an/or GaN having a thickness of about 100 nm to about 2 microns. In some embodiments, dislocation filter 1370 includes about two (2) to about 50 alternating layers of HfN having a thickness of about 5 nm to about 100 nm and AlN having a thickness of about 50 nm to about 500 nm.

In some embodiments, metal materials 1373 and III-nitride materials 1374 are selected such that the lattice constant of the metal material 1373 is greater than the lattice constant of III-nitride material 1374, in order that the metal material 1373 includes compressive stress when grown on III-nitride material 1374, which acts to react and annihilate dislocations and reduce the number of dislocation in subsequent alternating layers. In some embodiments, dislocation filter 1370 includes any of the PhC-GEMM structures described herein. In some embodiments, dislocation filter 1370 includes metal material (ZrN) 1373 and III-nitride material (GaN) 1374, or metal material (ZrN) 1373 and III-nitride material (AlN) 1374, or metal material (HfN) 1373 and III-nitride material (GaN) 1374, or metal material (HfN) 1373 and III-nitride material (AlN) 1374.

In some embodiments, epitaxial device structures are provided on the III-nitride dislocation filter growth template 1301 to form semiconductor devices (e.g., transistors, LEDs, LDs, sensors, filters, and the like).

Figure 13:
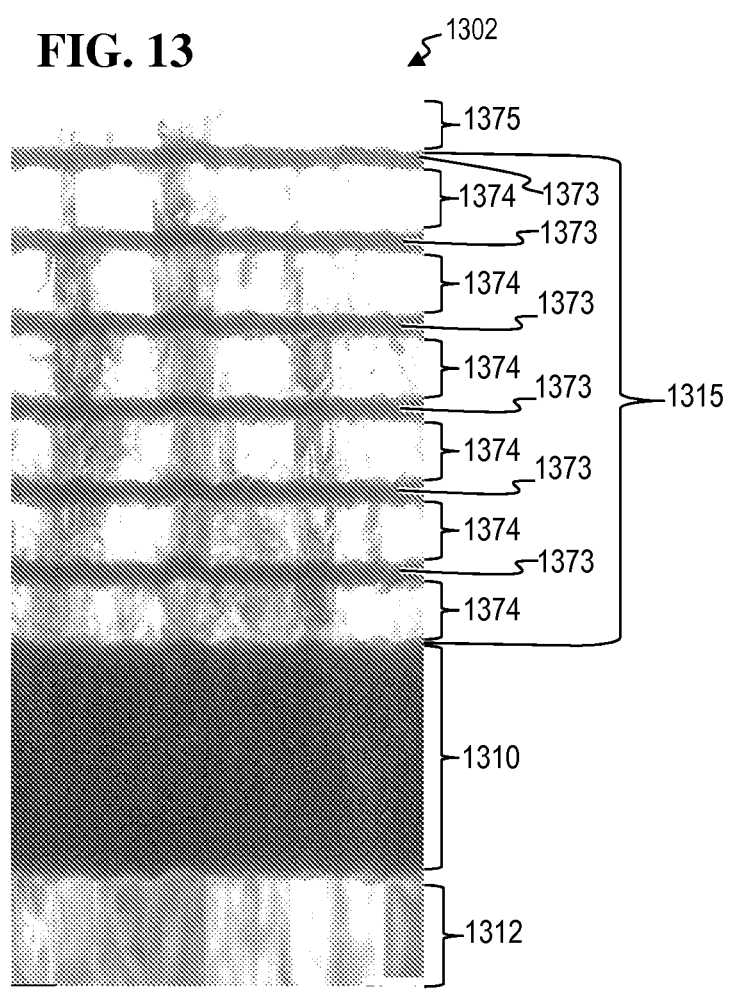
FIG. 13 is a cross-sectional TEM image of III-nitride dislocation filter growth template 1302, according to some embodiments of the present invention.

FIG. 13 is a cross-sectional TEM image of a portion of III-nitride dislocation filter growth template 1302, according to some embodiments of the present invention. In some embodiments, III-nitride dislocation filter growth template 1302 is substantially similar to III-nitride dislocation filter growth template 1301, and shows III-nitride transition layer (AlN) 1312, metal material base layer (HfN) 1310, dislocation filter 1315 (including six periods of alternating layers of AlN 1374 and HfN 1373), and III-nitride capping layer (AlN) 1375. As can be clearly seen in the cross-sectional TEM image, the number of dislocations, shown as the darker regions in the AlN layers (1312, 1374, and 1375) is steadily reduced as the number of alternating layers of AlN—HfN increases, and the final AlN capping is nearly free of dislocations, thereby "filtering out" the dislocations that were present in the III-nitride transition layer 1312.

Acoustic Wave Technology

Acoustic wave technology has been utilized for decades in the development and commercialization of acoustic wave devices (e.g., sensors and filters). Acoustic wave devices generally rely on piezoelectric materials to generate and detect the propagation of mechanic waves (i.e., acoustic waves) for devices operation. An overview of acoustic wave devices and technology is provided in the reference titled "Acoustic Wave Technology Sensors", (Drafts, Bill, "Acoustic Wave Technology Sensors", IEEE TRANSACTIONS ON MICROWAVE THEORY AND TECHNIQUES, VOL. 49, NO. 4, April 2001) which is hereby incorporated by reference in its entirety.

In some embodiments, the present invention provides materials, structures, devices, and methods for acoustic wave devices and technology, including epitaxial and non-epitaxial piezoelectric materials and structures useful for acoustic wave devices (AWD) including Surface Acoustic Wave Devices, Solidly Mounted Resonators, Solidly Mounted Filters, Bulk Acoustic Wave Devices, Film Bulk Acoustic Resonator Devices, and the like.

In some embodiments, the acoustic wave device includes metal-cermet (i.e., a composite material composed of ceramic (cer) and metallic (met)) materials, including but not limited to all metallic-cermet materials described above, and more specifically $(W_Y Mo_{1-Y})_X Ta_{1-X}$, wherein X=0 to 1, inclusive, and Y=0 to 1, inclusive, and $Hf_Z Zr_{1-Z}N$, wherein Z=0 to 1, inclusive. The cubic lattice spacing in the (111) lattice plane are W=2.87 Å, Mo=2.85 Å, Ta=3.07 Å, HfN=3.20 Å, ZrN=3.24 such that, in some embodiments, the compositional values (i.e., X, Y, and Z) are selected such that the lattice spacings of each metal-cermet material included in the metal-cermet composite described herein is substantially lattice matched to each other. As used herein, the term "metallic composition" refers to metallic-cermet material compositions as described above.

In some embodiments, the acoustic wave devices includes piezoelectric-dielectric-semiconductor materials, including but not limited to all piezoelectric-dielectric-semiconductor materials described above, and more specifically to compositions including, for example, $Sc_L((Al_J Ga_{(1-J)})_K In_{(1-K)})_{1-L}N$, wherein J=0 to 1, inclusive, K=0 to 1, inclusive, and L=0 to 1, inclusive. The lattice spacings of endpoints are AlN=3.11 Å, GaN=3.19 Å, InN=3.54 Å, and ScN=3.19 Å, where AlN, GaN, and InN generally are hexagonal, although they may rarely be cubic, and ScN is cubic. In some embodiments, the compositional values (i.e., J, K, and L) are selected such that the lattice spacings of each piezoelectric-dielectric-semiconductor material included in the piezoelectric-dielectric-semiconductor composite described herein is substantially lattice matched to each other. In some embodiments, the lattice spacings described above are substantially parallel. As used herein, the term "piezo composition" refers to piezoelectric-dielectric-semiconductor material compositions as described above.

In some embodiments, the present invention provides wave structures for acoustic wave devices that include combinations of two or more layers of metallic composition materials and/or piezo composition materials and, methods of such structures. In some such embodiments, the wave structures include one or more metallic composition layers in combination with one or more piezo composition layers. In some embodiments, the one or more metallic composition layers and the one or more piezo composition layers are epitaxial. In some embodiments, the thickness of each of the one or more metallic composition layers is substantially equal and the thickness of each of the one or more piezo composition layers is substantially equal. In other embodiments, the thickness of each of the one or more metallic composition layers is independent and the thickness of each of the one or more piezo composition layers is independent. In some embodiments, the wave structure includes two or more alternating layers of metallic composition layers and piezo composition layers. In other embodiments, the wave structure includes one or more metallic composition layers. In yet other embodiments, the wave structure includes one or more piezo composition layers.

In some embodiments, the wave structure includes materials layers (e.g., metallic composition layers and/or piezo composition layers) that are layered upon each other such that each layer has substantially a single phase and is substantially crystalline orientated in a single orientation.

In some embodiments, an epitaxial wave device structure includes a substrate, and a wave structure on the substrate. In some embodiments, the wave structure also includes a metallic composition layer on the substrate and a piezo composition layer on the metallic composition layer. In some embodiments, the epitaxial wave device structure further includes an optional metallic composition layer on the piezo composition layer. In some embodiments, the epitaxial wave device structure is processed using standard semiconductor fabrication techniques to form acoustic wave devices as described in the reference titled, "Acoustic Wave Technology Sensors" and provided above.

In some embodiments, an epitaxial wave device structure includes a substrate, and a wave structure on the substrate. In some embodiments, the wave structure includes a piezo composition layer on the substrate, and a metallic composition layer on the piezo composition layer. In some embodiments, the epitaxial wave device structure further includes an optional metallic composition layer on the piezo composition layer. In some embodiments, the epitaxial wave device structure is processed using standard semiconductor fabrication techniques to form acoustic wave devices as described in the reference titled, "Acoustic Wave Technology Sensors" and provided above.

In some embodiments, the present invention provides structures having thin layers of crystalline (and/or highly orientated crystalline grains) material, wherein the epitaxial material wave structure enables wave devices that operate at higher frequencies and have improved device performance (e.g., higher signal to noise ratios). In some embodiments, a wave structure as described above includes one or more layers of piezoelectric/dielectric/semiconductor material upon one or more layers of metal/cermet material and/or one or more layers of metal/cermet material upon one or more layers of piezoelectric/dielectric/semiconductor material such that the wave structure has a higher crystalline quality as compared to conventional wave device structures that have a less favorable epitaxial relationship and thereby require thicker layers to achieve the same level of crystal quality. For example, conventional wave device structures require converging coalescence of individually orientated crystalline grains during crystal growth to achieve good crystal quality and improve device performance. In some embodiments, the present invention provides a wave structure and method for achieving higher crystal alignment substantially without the need for converging coalescence. In some such embodiments, the crystalline "grains" of the epitaxial materials in the wave structure are substantially aligned. In some embodiments, the term "grains" refers to crystalline grains that are so closely aligned that they are substantially fully coalesced and/or converged and that two or more "grains" may actually be considered one macro "grain", also known as epitaxial and/or "single crystal" and/or "highly orientated polycrystalline" and/or "highly orientated multi-crystalline".

In some embodiments, the performance of acoustic wave devices is improved when thinner Piezoelectrics/Dielectrics/Semiconductors films are used (e.g., high frequency performance of acoustic wave devices improves when thin epitaxial piezo composition layers are used). In some embodiments, the present invention provides materials that have excellent epitaxial relationships (e.g., are lattice matched) to enable wave devices with thin epitaxial layers to improve performance. In some embodiments, the frequency generation and response of some acoustic wave devices are inversely proportional to the thickness of the Piezoelectrics/Dielectrics/Semiconductors materials and such frequencies can only be reached if the crystal orientation (including polarity of polar films) is substantially continuous of the entire thickness of the film.

In some embodiments, the present invention provides monolithic integration of thinner acoustic wave devices with various semiconductor devices, including, but not limited to electrical devices, optical devices, passives (e.g., resistors, capacitors, and the like), transistors, sensors, micro-electromechanical devices (MEMs), and the like. In some embodiments, the acoustic wave devices, as described herein, are combined with PhC-GEMM structure technology, as described above, such that the PhC-GEMM structure utilizes the piezoelectric nature of AlN, and/or GaN and/or InN.

In some embodiments, the acoustic wave structures and devices described herein include components used for processing frequency signals such as oscillators, resonators, filters, reflectors, transmitters, and the like.

In some embodiments, the acoustic wave structures and devices described herein operate in the wavelength regions that include radio, microwave, infrared, visible, UV, deep UV, and x-ray.

In some embodiments, the metallic composition material and piezo composition material, as describe herein, are also be used to improve the performance and/or reduce the size of more "traditionally physical" devices, including but not limited to MEMs devices such as mirror arrays, cantilevers, actuators, motors, and the like.

Metal Base Transistor Technology

In some embodiments, the present invention provides metal-base transistor devices, structures, materials and methods of forming metal-base transistor material structures for use in semiconductor devices. Specifically, in some embodiments, the present invention provides metal-base transistors that include materials and structures that include combinations of one or more layers of metallic materials (e.g., as described above, including but not limited to metal nitrides) and one or more layers of semiconductor materials, dielectric materials, and/or combinations of semiconductor and dielectric materials, and methods of forming such devices, structures, and materials, wherein the semiconductor materials and dielectric materials have been described above. In some embodiments, the one or more metallic layers and the one or more semiconductor and/or dielectric layers are formed epitaxially and are substantially single crystal and substantially lattice matched to each other. In other embodiments, the one or more metallic layers and the one or more semiconductor and/or dielectric layers are deposited non-epitaxially.

In some embodiments, the present invention provides a plurality of layers of epitaxial metal and semiconductor materials to form metal-base transistor devices, structures, and materials and methods of forming such metal-base transistor devices, structures, materials, such that the metal layers and semiconductor layers are substantially lattice matched.

In some embodiments, the present invention provides a plurality of layers of epitaxial metal, semiconductor, and dielectric materials to form epitaxial metal-base transistor devices, structures, and materials and methods of forming such epitaxial metal-base transistor devices, structures, materials, such that the metal layers and dielectric layers are substantially lattice matched.

In some embodiments, the plurality of layers of metal and semiconductor materials forms metal-base transistor devices and structures. In some embodiments, one or more dielectric material layers are included with and/or combined with the metal-base transistor structures described above to form a metal-base transistor structure that is useful for integrating electrical and optical semiconductor devices.

In some embodiments, as used herein, the metal-base transistor is also referred to as a "hot carrier transistor" and/or a "tunneling hot carrier transistor" and/or a "hot electron transistor" and/or a "tunneling hot electron transistor".

In some embodiments, as used herein, the metal materials used to form the metal-base are referred to as grown-epitaxial metal mirrors (GEMMs) and a metal-base transistor that includes a GEMM metal-base is referred to as a GEMM-base transistor. In some embodiments, the present invention includes PhC-GEMM structures as described above. In some embodiments, the present invention provides a GEMM-base transistor and methods for fabricating a GEMM-base transistor, wherein the GEMM is a metal layer, and the GEMM-base transistor includes the following benefits:

GEMM-base transistors have base conductivities that are 1,000 times greater than conventional bipolar transistors Reduced RC delay associated with charging the base-emitter capacitance thereby increasing the Ft/Fmax of the operating transistor Reduced ionized impurity scattering because metals do not require doping GEMM layers can be made extremely thin to achieve large mean free path carrier lengths Schottky barrier height of GEMM at interfaces can be engineered to be large GEMM-base transistor device fabrication uses standard semiconductor processes and equipment Ohmic electrical contacts are readily formed with the GEMM-base metal Wafer bonding and substrate removal is not required Surface depletion in a thin-base GEMM-base transistor is not a problem compared to a base formed with semiconductor materials Preliminary published simulations for a well designed laterally and vertically scaled GaN-based HET [Hot Electron Transistor], with $Al_xGa_{1-x}N$ emitter and $Al_yGa_{1-y}N$ collector (x>y), have demonstrated possibilities of sub-terahertz (0.6 THz) to terahertz cutoff frequency operation, as described by Sansaptak Dasgupta in (Sansaptak, et al., "Experimental Demonstration of III-Nitride Hot-Electron Transistor With GaN Base" IEEE Electron Device Letters, VOL. 32, NO. 9, 1212-1214, September 2011), which is hereby incorporated by reference in its entirety.

In some embodiments, the present invention provides a three terminal GEMM-base transistor that includes an emitter layer, a GEMM-base layer, and a collector layer. In some embodiments, the emitter layer includes a metallic material (as described above), III-nitride materials and compositions (doped and undoped). In some embodiments, the collector layer includes a metallic material (as described above), III-nitride materials and compositions (doped and undoped). In some embodiments, the GEMM-base layer includes a metallic material, as described above (e.g., HfN, ZrN, TiN, combinations, multiple layers, and the like). In some embodiments, the GEMM-base transistor further includes one or more electron or hole barrier layer. In some embodiments, the barrier layer includes III-nitride materials and compositions (doped or undoped). In other embodiments, the emitter layer, and/or the GEMM-base layer, and/or the collector layer, and/or the one or more barrier layers include magnetic materials. In yet other embodiments, the emitter layer, and/or the GEMM-base layer, and/or the collector layer, and/or the one or more barrier layers are superconducting. In some embodiments, the barrier layers have a thickness that allows electrons to tunnel through the barriers (e.g., about 1 nm to about 50 nm, or more specifically about 1 nm to about 10 nm).

FIG. 14A is a block diagram of metal base transistor structure 1501.1 and corresponding energy diagram 1501.2, according to some embodiments of the present invention. In some embodiments, metal base transistor structure 1501.1 includes substrate 1511, collector layer 1590 on substrate 1511, first barrier layer 1595 on collector layer 1590, GEMM-base layer 1591 on first barrier layer 1595, second barrier layer 1596 on GEMM-base layer 1591, and emitter layer 1592 on second barrier layer 1596. In some embodiments, collector layer 1590 includes n-GaN, first barrier layer 1595 includes n-AlGaN, GEMM-base layer 1591 includes HfN, second barrier layer 1596 includes n-AlGaN, and emitter layer 1592 includes n-GaN.

In some embodiments, energy diagram 1501.2 shows the electron conduction band 1599 and the ability of an electron 99 to tunnel through 1598 and/or over, via thermionic emission 1597, second barrier 1596.

In some embodiments, first barrier layer 1595 and second barrier layer 1596 are not included such that collector layer 1590 and emitter layer 1592 form Schottky contacts with GEMM-base layer 1591.

FIG. 14B is a block diagram of metal base transistor structure 1502.1 and corresponding energy diagram 1502.2, according to some embodiments of the present invention. In some embodiments, metal base transistor structure 1502.1 is substantially similar to metal base transistor structure 1501.1, except that metal base transistor structure 1502.1 does not include a first barrier layer, and therefore, collector layer 1590 is in direct contact and forms a Schottky contact 1588 with GEMM-base layer 1591. In some embodiments, energy diagram 1502.2 shows the electron conduction band 1599 and the ability of an electron 99 to tunnel through 1598 and/or over, via thermionic emission 1597, second barrier 1596.

FIG. 14C is a block diagram of metal base transistor structure 1503.1 and corresponding energy diagram 1503.2, according to some embodiments of the present invention. In some embodiments, metal base transistor structure 1503.1 is substantially similar to metal base transistor structure 1501.1, except that metal base transistor structure 1503.1 does not include either a first barrier layer or a second barrier layer, and therefore, collector layer 1590 is in direct contact and forms a Schottky contact 1588 with GEMM-base layer 1591 and emitter layer 1592 is in direct contact and forms a Schottky contact 1588 with GEMM-base layer 1591. In some embodiments, energy diagram 1503.2 shows the electron conduction band 1599 and the ability of an electron 99 to tunnel through 1598 and/or over, via thermionic emission 1597, second barrier 1596.

FIG. 14D is a block diagram of metal base transistor structure 1504.1 and corresponding energy diagram 1504.2, according to some embodiments of the present invention. In some embodiments, metal base transistor structure 1504.1 is substantially similar to metal base transistor structure 1502.1, except that metal base transistor structure 1504.1 further includes a resonance cavity 1585 placed in the middle of second barrier layer 1596 in order to induce resonant tunneling of electrons 1598. In some embodiments, energy diagram 1502.2 shows the electron conduction band 1599 and the ability of an electron 99 to resonantly tunnel through 1598 and/or over, via thermionic emission 1597, split second barrier 1596.

It is specifically contemplated that the present invention includes embodiments having combinations and subcombinations of the various embodiments and features that are individually described herein (i.e., rather than listing every combinatorial of the elements, this specification includes descriptions of representative embodiments and contemplates embodiments that include some of the features from one embodiment combined with some of the features of another embodiment). Further, some embodiments include fewer than all the components described as part of any one of the embodiments described herein. Still further, it is specifically contemplated that the present invention includes embodiments having combinations and subcombinations of the various embodiments described herein and the various embodiments described by the related applications incorporated by reference in the second paragraph of the present application.

It is to be understood that the above description is intended to be illustrative, and not restrictive. Although numerous characteristics and advantages of various embodiments as described herein have been set forth in the foregoing description, together with details of the structure and function of various embodiments, many other embodiments and changes to details will be apparent to those of skill in the art upon reviewing the above description. The scope of the invention should be, therefore, determined with reference to the appended claims, along with the full scope of equivalents to which such claims are entitled. In the appended claims, the terms "including" and "in which" are used as the plain-English equivalents of the respective terms "comprising" and "wherein," respectively. Moreover, the terms "first," "second," and "third," etc., are used merely as labels, and are not intended to impose numerical requirements on their objects.

What is claimed is:

1. An optical-electrical device comprising:
   a first layered structure, wherein the first layered structure has a reflectivity at a wavelength of light used in the device, and wherein the first layered structure includes:
   a substrate having a top surface and a bottom surface; and
   a plurality of periods of a metallo-semiconductor on the top surface of the substrate,
   wherein each of the plurality of periods includes a first layer and a second layer,
   wherein the first layer is a metal material having a thickness of between about 15 nanometers (nm) and about 45 nm and characterized by an optical penetration depth, and the second layer is a semiconductor having a thickness d1, and
   wherein the first layer is substantially lattice matched to the second layer.

2. The device of claim 1, wherein the metal material includes HfN and the semiconductor includes GaN.

3. The device of claim 1, wherein the metal material includes ZrN and the semiconductor includes GaN.

4. The device of claim 1, wherein the metal material includes HfN and the semiconductor includes AlN.

5. The device of claim 1, wherein the metal material includes ZrN and the semiconductor includes AlN.

6. The device of claim 1, wherein the metal material includes Hf and the semiconductor includes a III-nitride material.

7. An optical-electrical device comprising:
   a first layered structure, wherein the first layered structure has a reflectivity at a wavelength of light used in the device, and wherein the first layered structure includes:
   a substrate having a top surface and a bottom surface; and
   a plurality of periods of a metallo-semiconductor on the top surface of the substrate,
   wherein each of the plurality of periods includes a first layer and a second layer,
   wherein the first layer is a metal material having a thickness and characterized by an optical penetration depth, and the second layer is a semiconductor having a thickness d1, and
   wherein the first layer is substantially lattice matched to the second layer, wherein $d1=m*\lambda_o/(2*n)-PD$, where m is an integer, n is an index of refraction of the semiconductor, $\lambda_o/n$ is the wavelength of the light in the semiconductor, $\lambda_o$ is the wavelength of the light in vacuum, and PD is the optical penetration depth of the light into the metal material if the thickness of the first layer is greater than the optical penetration depth and otherwise PD is the thickness of the first layer.

8. An optical-electrical device comprising:
   a first layered structure, wherein the first layered structure has a reflectivity at a wavelength of light used in the device, and wherein the first layered structure includes:
   a substrate having a top surface and a bottom surface; and
   a plurality of periods of a metallo-semiconductor on the top surface of the substrate,
   wherein each of the plurality of periods includes a first layer and a second layer,
   wherein the first layer is a metal material having a thickness and characterized by an optical penetration depth, and the second layer is a semiconductor having a thickness d1, and
   wherein the first layer is substantially lattice matched to the second layer, wherein the optical-electrical device further includes:
   a metal-cap layer on the first layered structure, wherein the metal-cap layer includes a metal material;
   a III-nitride cap layer on the metal-cap layer, wherein the III-nitride cap layer includes at least one of the group consisting of AlN and GaN; and
   a semiconductor device on the III-nitride cap layer, wherein the semiconductor device includes a layer of N-type III-nitride material, a layer of P-type III-nitride material, and an active layer located between the layer of N-type III-nitride material and the layer of P-type III-nitride material, and wherein the active layer includes a plurality of quantum wells.

9. An optical-electrical device comprising:
   a first layered structure, wherein the first layered structure has a reflectivity at a wavelength of light used in the device, and wherein the first layered structure includes:
   a substrate having a top surface and a bottom surface; and
   a plurality of periods of a metallo-semiconductor on the top surface of the substrate,
   wherein each of the plurality of periods includes a first layer and a second layer,
   wherein the first layer is a metal material having a thickness and characterized by an optical penetration depth, and the second layer is a semiconductor having a thickness d1, and
   wherein the first layer is substantially lattice matched to the second layer, wherein the optical-electrical device further includes:
   a semiconductor device on the first layered structure, wherein the semiconductor device includes a layer of N-type III-nitride material, a layer of P-type III-nitride material, and an active layer located between the layer of N-type III-nitride material and the layer of P-type III-nitride material, wherein the active layer includes a plurality of quantum wells; and
   a second layered structure on the semiconductor device, wherein the second layered structure includes a plurality of metallo-semiconductor periods, and wherein the active layer is positioned at an antinode of an optical cavity formed by the first and second layered structures.

10. An optical-electrical device comprising:
    a first layered structure, wherein the first layered structure has a reflectivity at a wavelength of light used in the device, and wherein the first layered structure includes:
    a substrate having a top surface and a bottom surface; and
    a plurality of periods of a metallo-semiconductor on the top surface of the substrate,
    wherein each of the plurality of periods includes a first layer and a second layer,
    wherein the first layer is a metal material having a thickness and characterized by an optical penetration depth, and the second layer is a semiconductor having a thickness d1, and
    wherein the first layer is substantially lattice matched to the second layer, and wherein the optical-electrical device further includes:
    a second layered structure on the first layered structure, wherein the second layered structure includes a plurality of metallo-semiconductor periods, and wherein the first layered structure is reflective to 450-nm-wavelength light and partially transparent to 460-nm-wavelength light, and wherein the second layered structure is reflective to 460-nm-wavelength light.

11. An optical-electrical device comprising:
a first layered structure, wherein the first layered structure has a reflectivity at a wavelength of light used in the device, and wherein the first layered structure includes:
a substrate having a top surface and a bottom surface; and
a plurality of metallo-dielectric periods on the top surface of the substrate, wherein each of the plurality of periods includes a first layer and a second layer, wherein the first layer is a metal material having a thickness and characterized by an optical penetration depth, and the second layer is a dielectric having a thickness d, and wherein the first layer is substantially lattice matched to the second layer.

12. The device of claim 11, wherein the dielectric includes a dielectric selected from the group consisting of $SiO_2$, $GeO_2$, $Si_3N_4$, $Ga_2O_3$, $In_2O_3$, and $Al_2O_3$.

13. The device of claim 11, wherein the metal material includes HfN, and wherein the dielectric includes a silicate.

14. The device of claim 11, wherein the metal material includes HfN.

15. The device of claim 11, wherein the metal material includes ZrN.

16. The device of claim 11, wherein $d=m*\lambda_o/(2*n)-PD$, where m is an integer, n is an index of refraction of the dielectric, $\lambda_o/n$ is the wavelength of the light in the dielectric, $\lambda_o$ is the wavelength of the light in vacuum, and PD is the optical penetration depth of the light into the metal material if the thickness of the first layer is greater than the optical penetration depth and otherwise PD is the thickness of the first layer.

17. The device of claim 11, wherein the optical-electrical device further includes:
a metal-cap layer on the first layered structure, wherein the metal-cap layer includes a metal material;
a III-nitride cap layer on the metal-cap layer, wherein the III-nitride cap layer includes at least one of the group consisting of AlN and GaN; and
a semiconductor device on the III-nitride cap layer, wherein the semiconductor device includes a layer of N-type III-nitride material, a layer of P-type III-nitride material, and an active layer located between the layer of N-type III-nitride material and the layer of P-type III-nitride material, and wherein the active layer includes a plurality of quantum wells.

18. An optical-electrical device comprising:
a substrate having a top surface and a bottom surface; and
a plurality of metallo-semiconductor periods on the top surface of the substrate, wherein each of the plurality of periods includes a first layer and a second layer, wherein the first layer of each period is a metal material having a thickness of between about 15 nanometers (nm) and about 45 nm and characterized by an optical penetration depth, and the second layer of each period is a semiconductor, wherein the first layer is substantially lattice matched to the second layer, and wherein the second layer has a thickness d1.

19. The device of claim 18, wherein $d1=m*\lambda_o/(2*n)-PD$, where m is an integer, n is an index of refraction of the second layer, $\lambda_o/n$ is a wavelength of generated light in the second layer, $\lambda_o$ is a wavelength of the light in vacuum, and PD is the optical penetration depth of the light into the metal material if the thickness of the first layer is greater than the optical penetration depth and otherwise PD is the thickness of the first layer.

20. The device of claim 7, wherein the metal material includes a transition metal nitride, and wherein the semiconductor includes a III-nitride material.

* * * * *